(12) United States Patent
Brech et al.

(10) Patent No.: US 10,707,818 B1
(45) Date of Patent: Jul. 7, 2020

(54) RF AMPLIFIER WITH IMPEDANCE MATCHING COMPONENTS MONOLITHICALLY INTEGRATED IN TRANSISTOR DIE

(71) Applicant: Infineon Technologies AG, Neubiberg (DE)

(72) Inventors: Helmut Brech, Lappersdorf (DE); Richard Wilson, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 18 days.

(21) Appl. No.: 16/219,025

(22) Filed: Dec. 13, 2018

(51) Int. Cl.
| | | |
|---|---|---|
| *H03F 3/187* | (2006.01) | |
| *H03F 3/195* | (2006.01) | |
| *H03F 1/56* | (2006.01) | |
| *H03F 3/193* | (2006.01) | |
| *H03H 7/38* | (2006.01) | |
| *H03F 3/213* | (2006.01) | |

(52) U.S. Cl.
CPC ............. *H03F 3/195* (2013.01); *H03F 1/565* (2013.01); *H03F 3/193* (2013.01); *H03F 3/213* (2013.01); *H03H 7/38* (2013.01); *H01L 2223/6644* (2013.01); *H03F 2200/387* (2013.01); *H03F 2200/451* (2013.01)

(58) Field of Classification Search
CPC ....................................................... H03F 3/187
USPC ....................................... 330/307, 305, 302
See application file for complete search history.

(56) References Cited

U.S. PATENT DOCUMENTS

| | | | |
|---|---|---|---|
| 10,141,303 B1* | 11/2018 | Canning | ........... H01L 23/49838 |
| 2018/0350758 A1 | 12/2018 | Liu et al. | |
| 2019/0088642 A1* | 3/2019 | Canning | ............... H01L 23/053 |
| 2019/0165753 A1* | 5/2019 | Arigong | ................ H03F 1/0222 |
| 2019/0343005 A1* | 11/2019 | Santos | ................... H05K 3/284 |

OTHER PUBLICATIONS

Arigong, Bayaner, et al., "RF Amplifier with Dual Frequency Response Capacitor", U.S. Appl. No. 15/667,195, filed Aug. 2, 2017, 1-34.
Arigong, Bayaner, et al., "RF Power Amplifier with Combined Baseband, Fundamental and Harmonic Tuning Network", U.S. Appl. No. 15/823,155, filed Nov. 27, 2017, 1-32.

* cited by examiner

*Primary Examiner* — Henry Choe
(74) *Attorney, Agent, or Firm* — Murphy, Bilak & Homiller, PLLC

(57) ABSTRACT

A packaged amplifier circuit includes an RF package with a die pad, and RF input and output leads extending away from the die pad opposite directions. An RF transistor die is mounted on the die pad such that a first outer edge side of the RF transistor die faces the first RF lead and a second outer edge side of the RF transistor die faces the second RF lead. A passive electrical connector is integrally formed in the RF transistor die. The passive electrical connector includes a first end connection point closer to the first outer edge side, and a second end connection point closer to the second outer edge side. A first discrete reactive device is mounted on the die pad between the first outer edge side and the first RF lead. The passive electrical connector electrically couples the first discrete reactive device to the second RF lead.

27 Claims, 14 Drawing Sheets

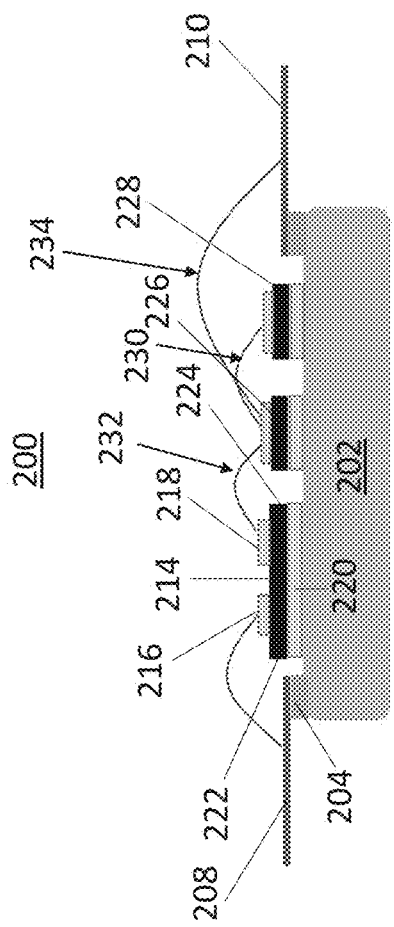
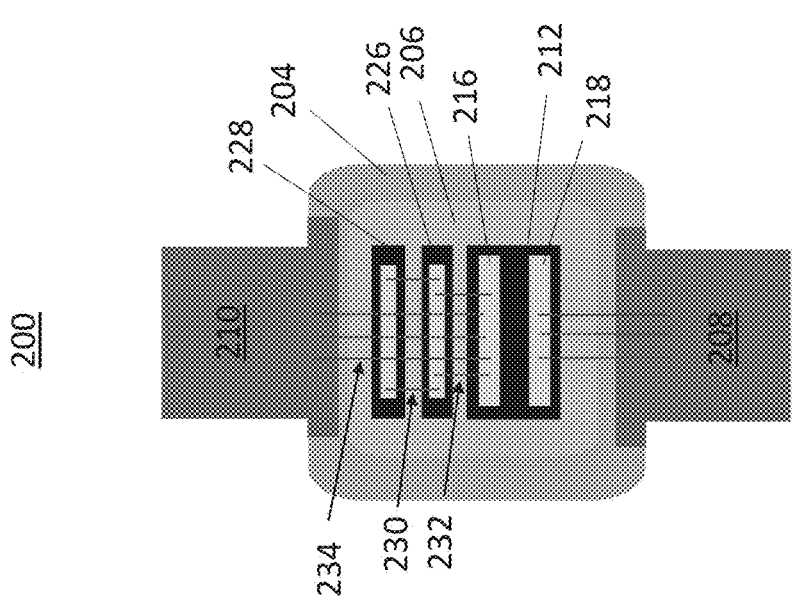

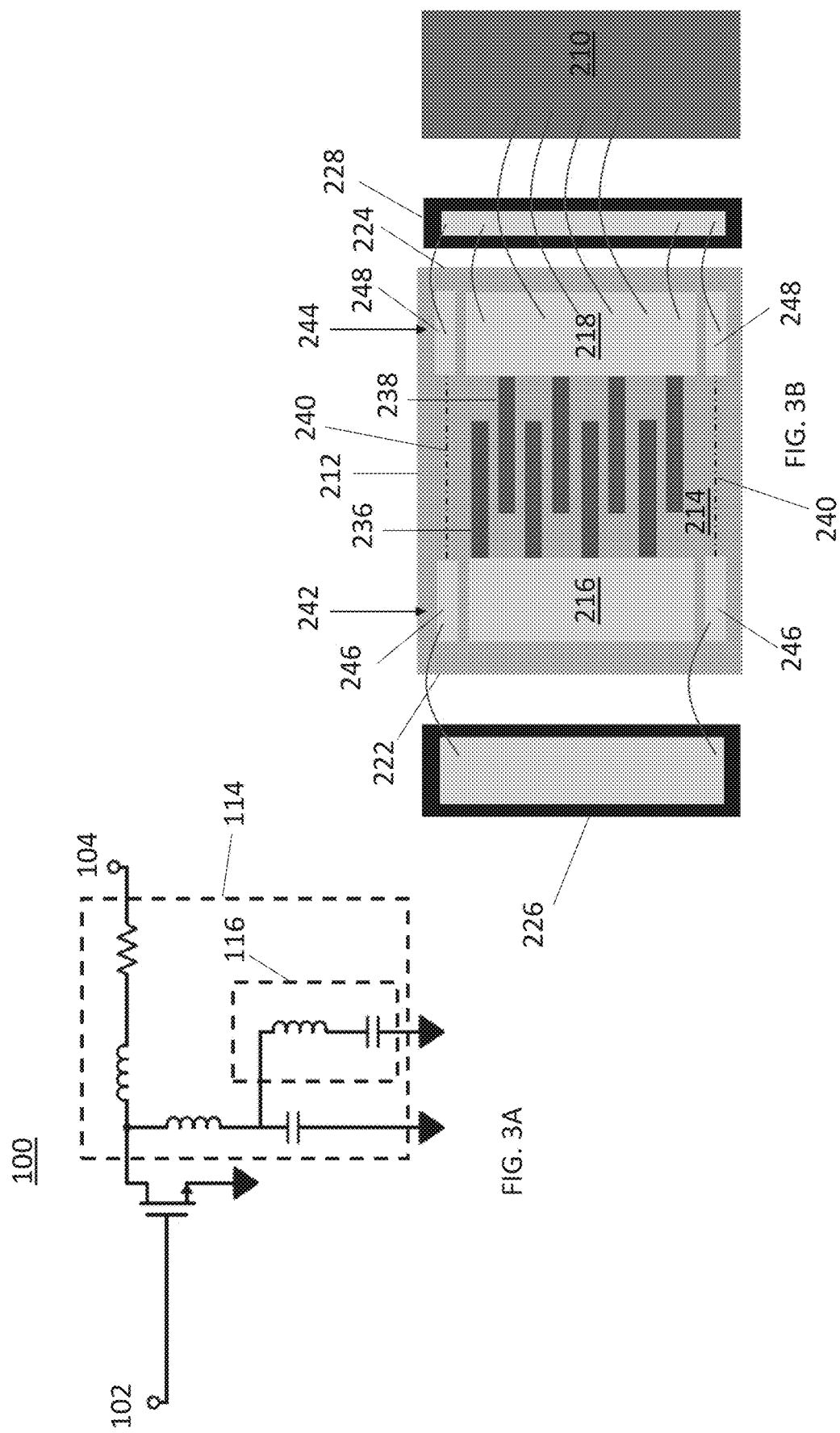

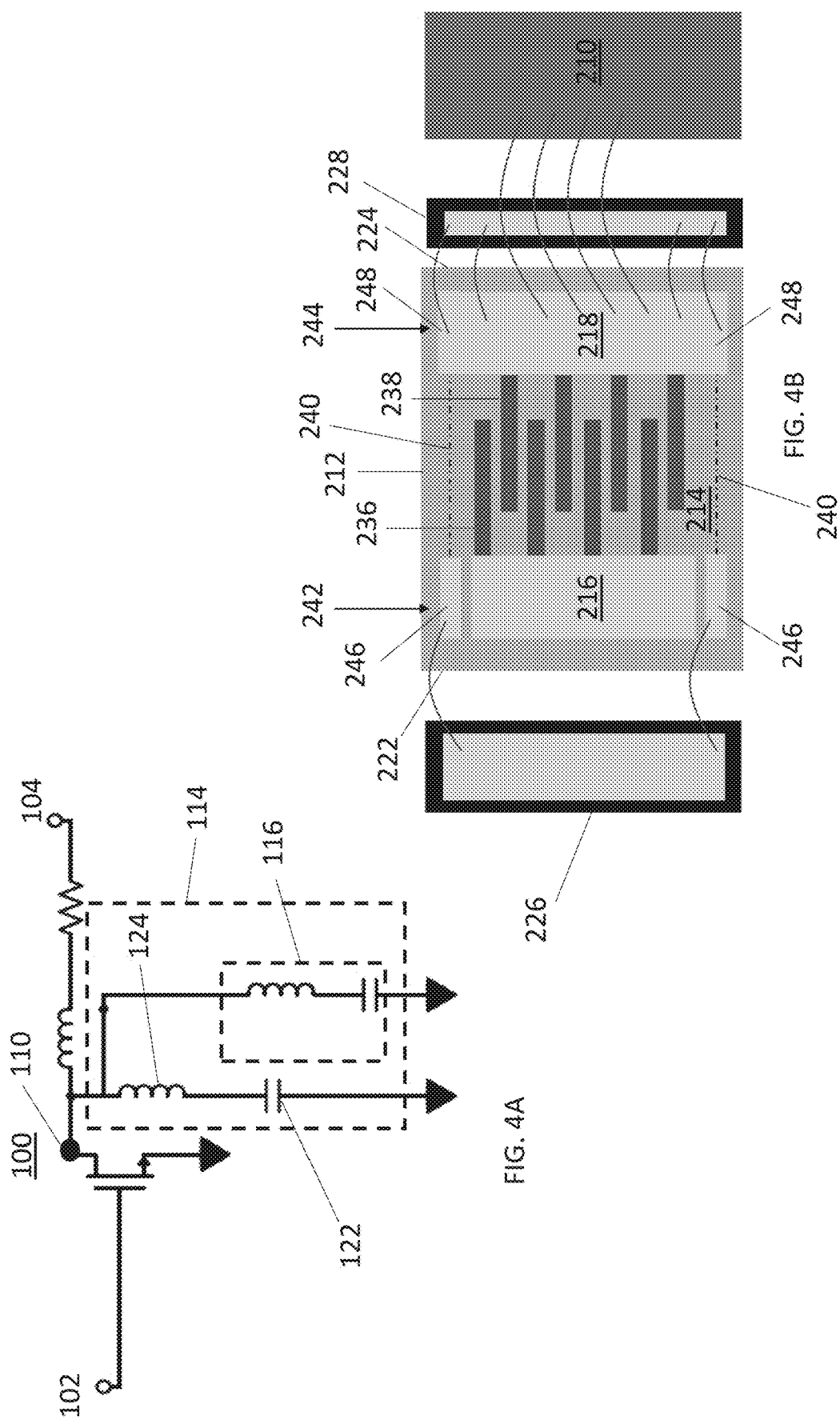

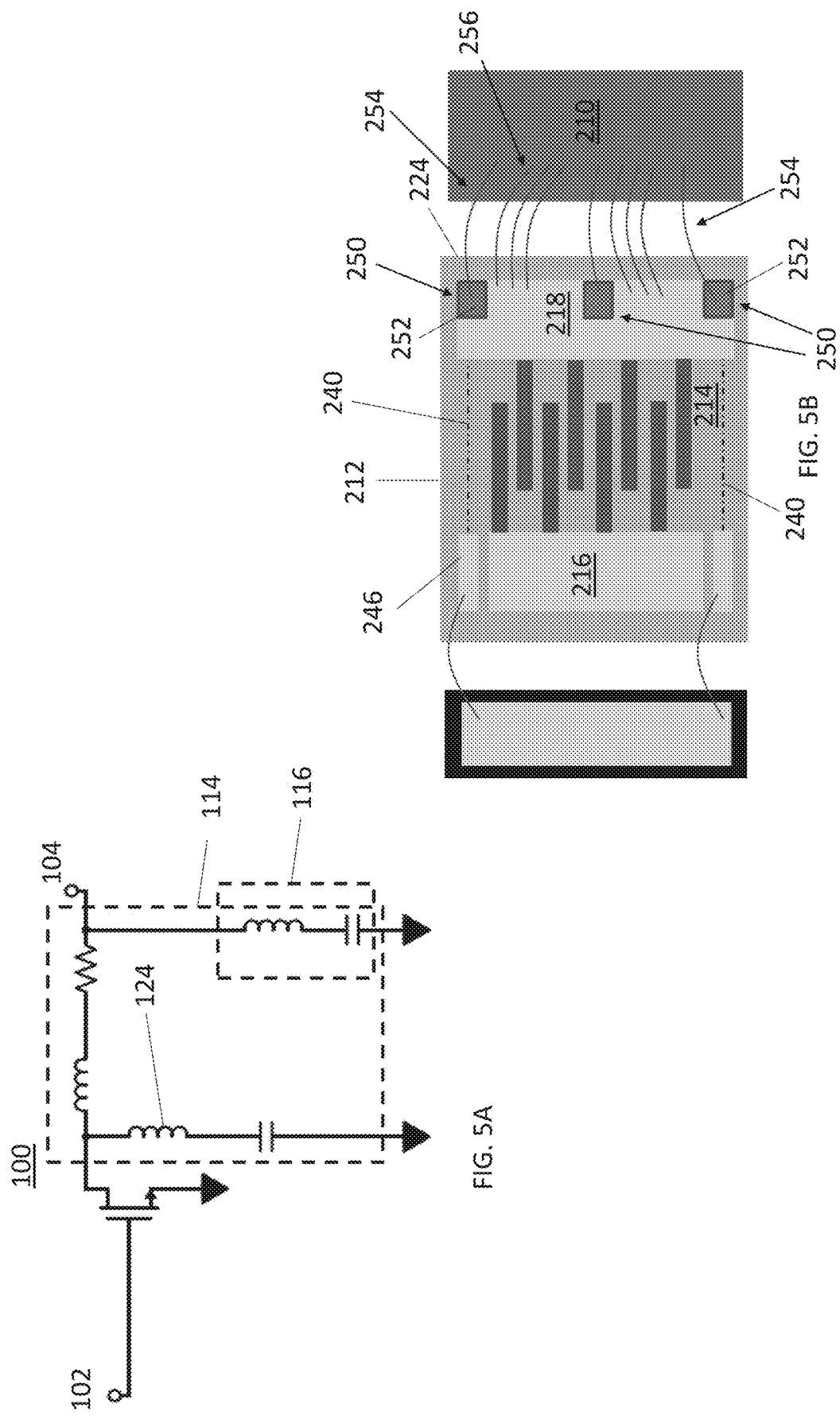

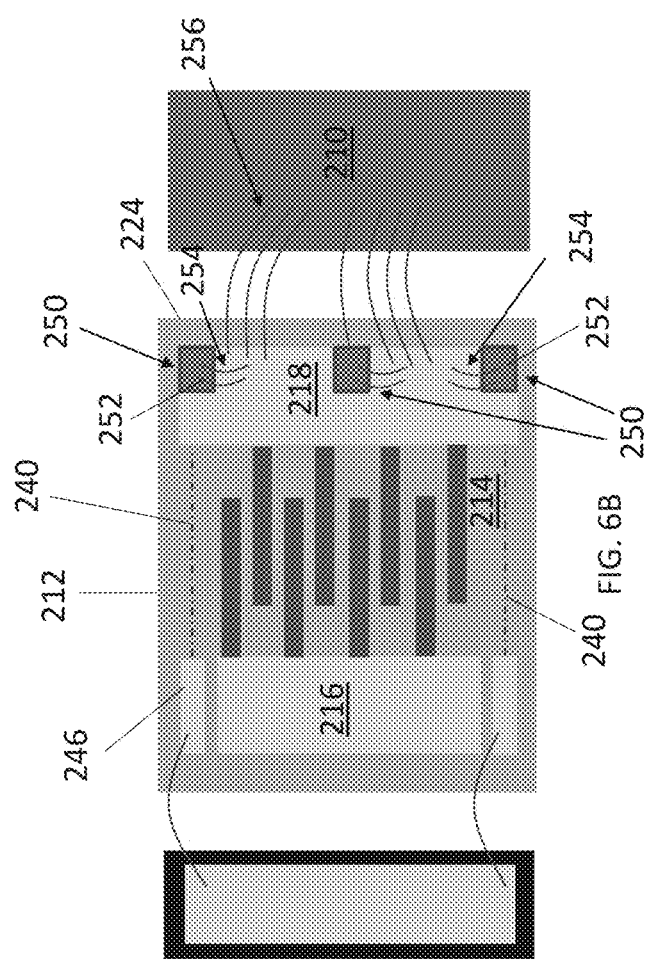
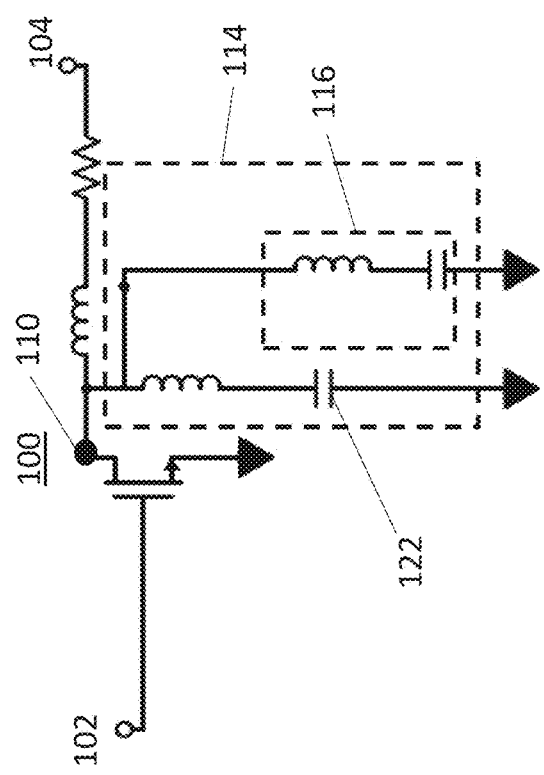
FIG. 6A
FIG. 6B

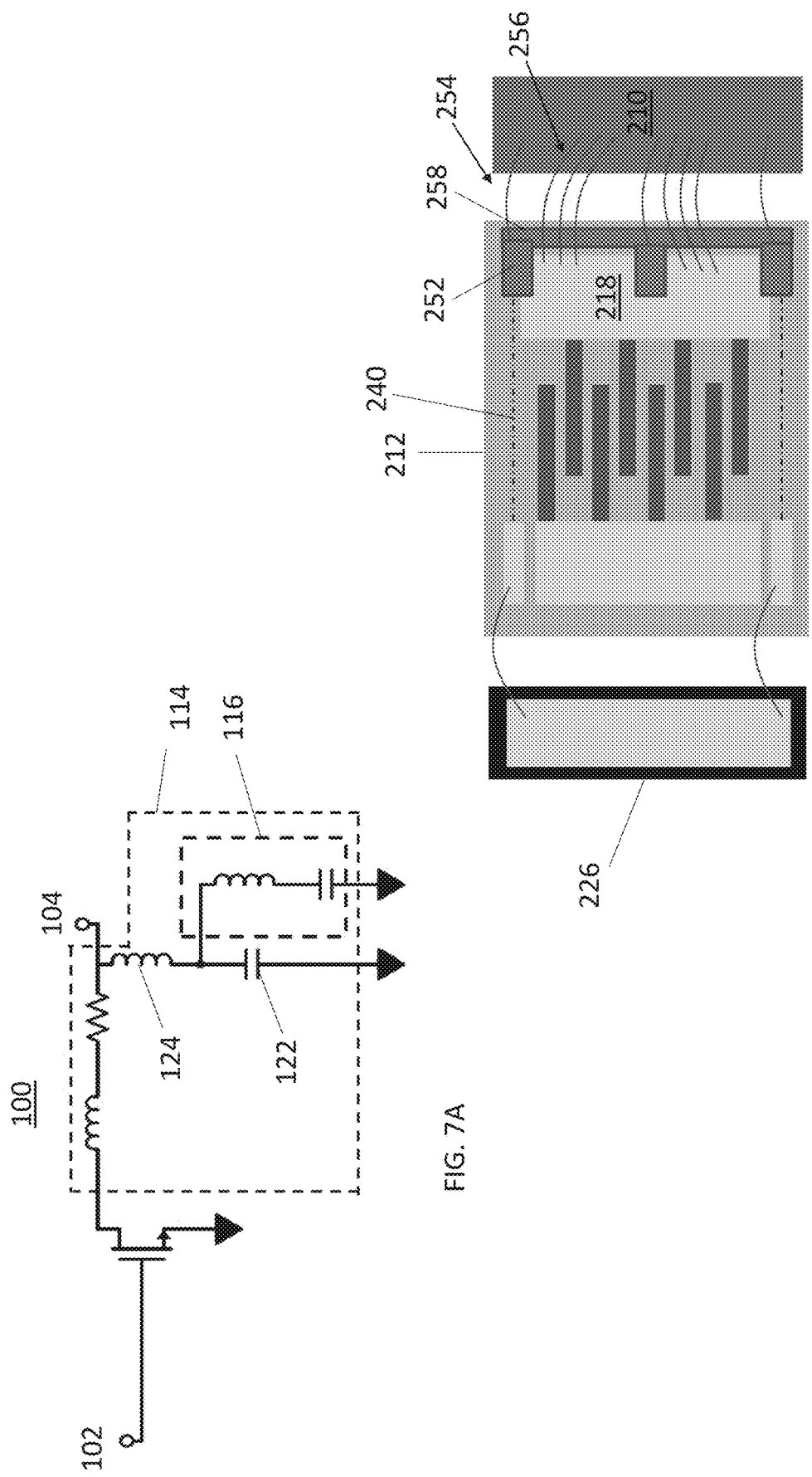

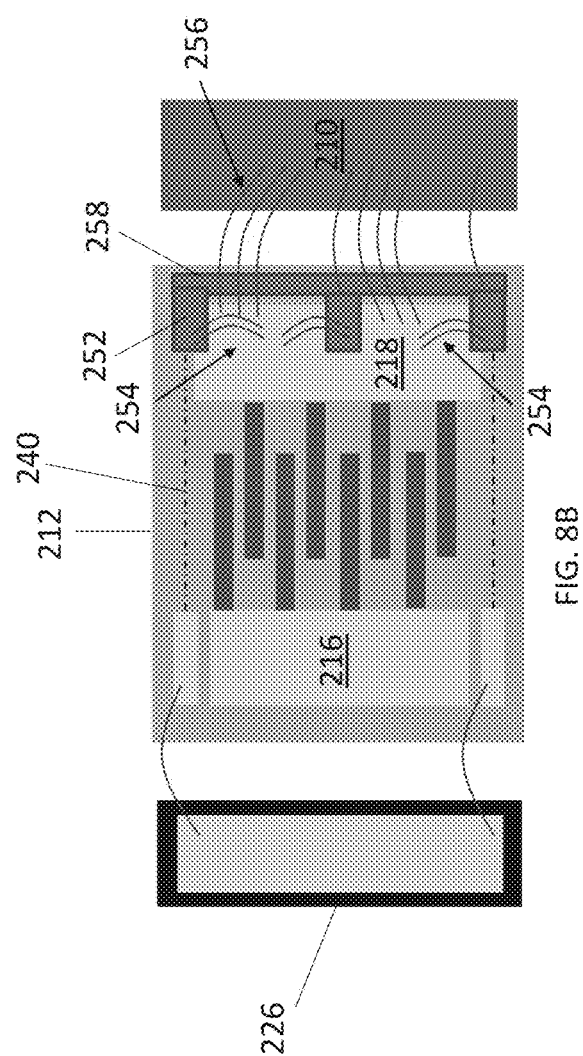
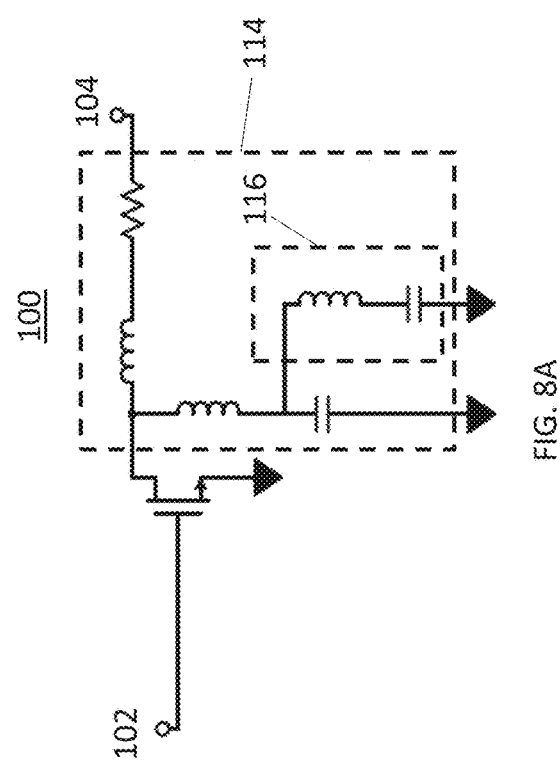
FIG. 8A
FIG. 8B

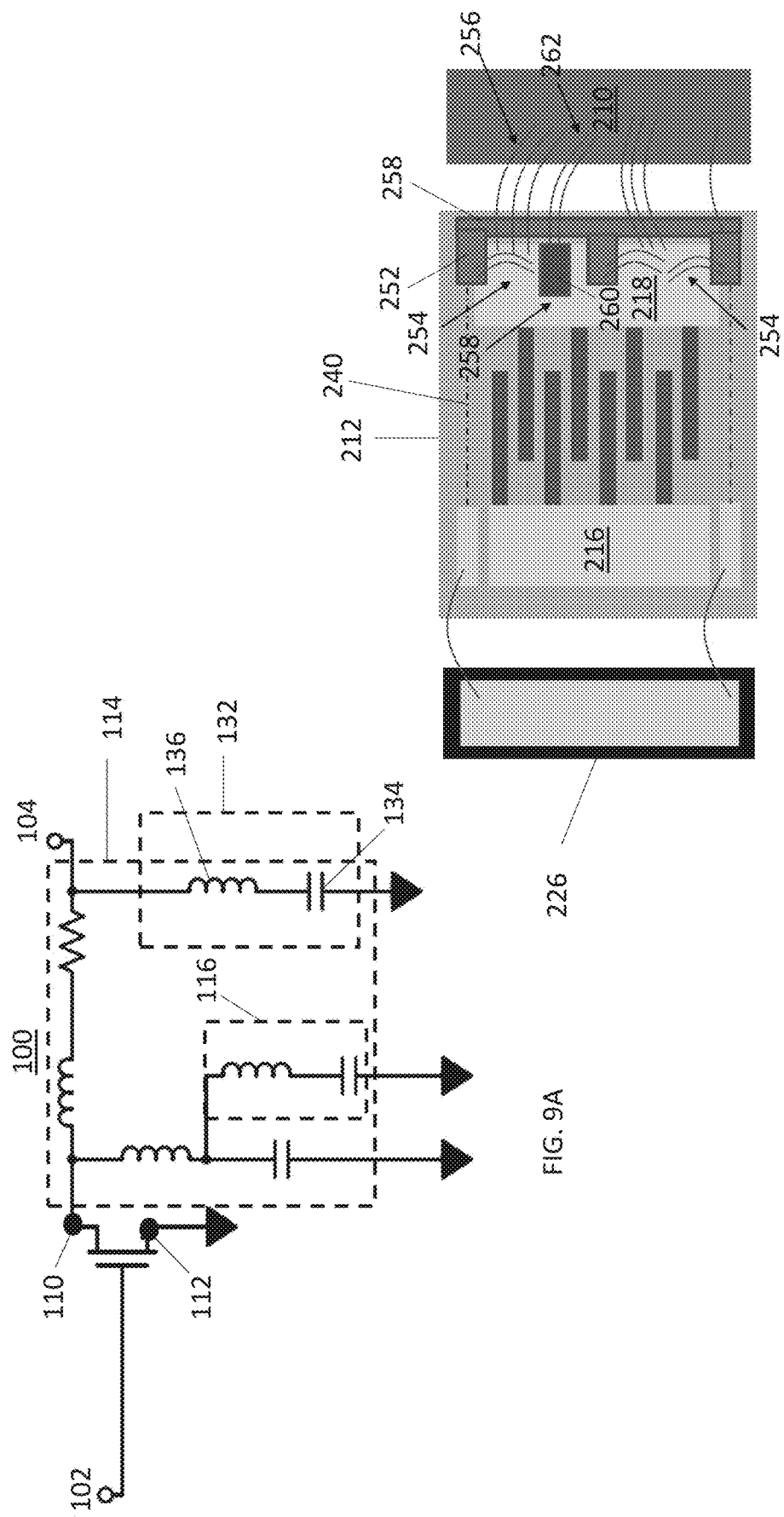

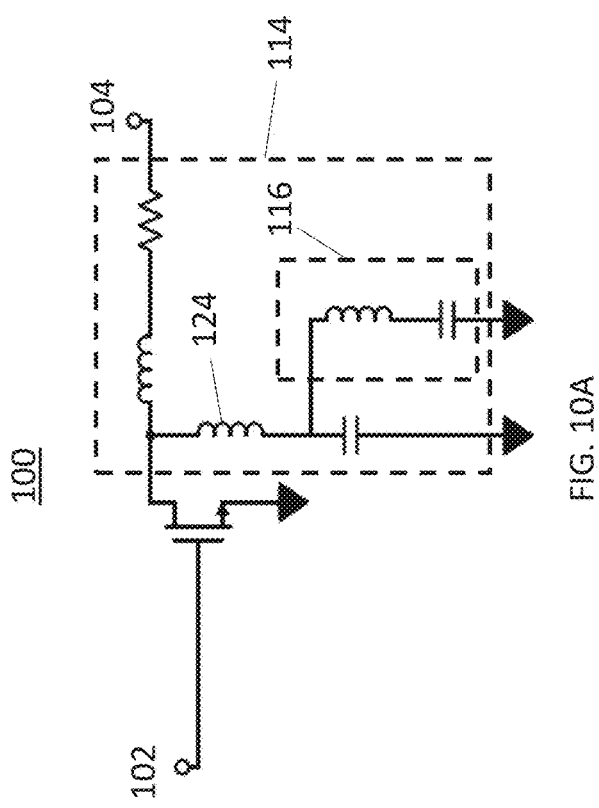

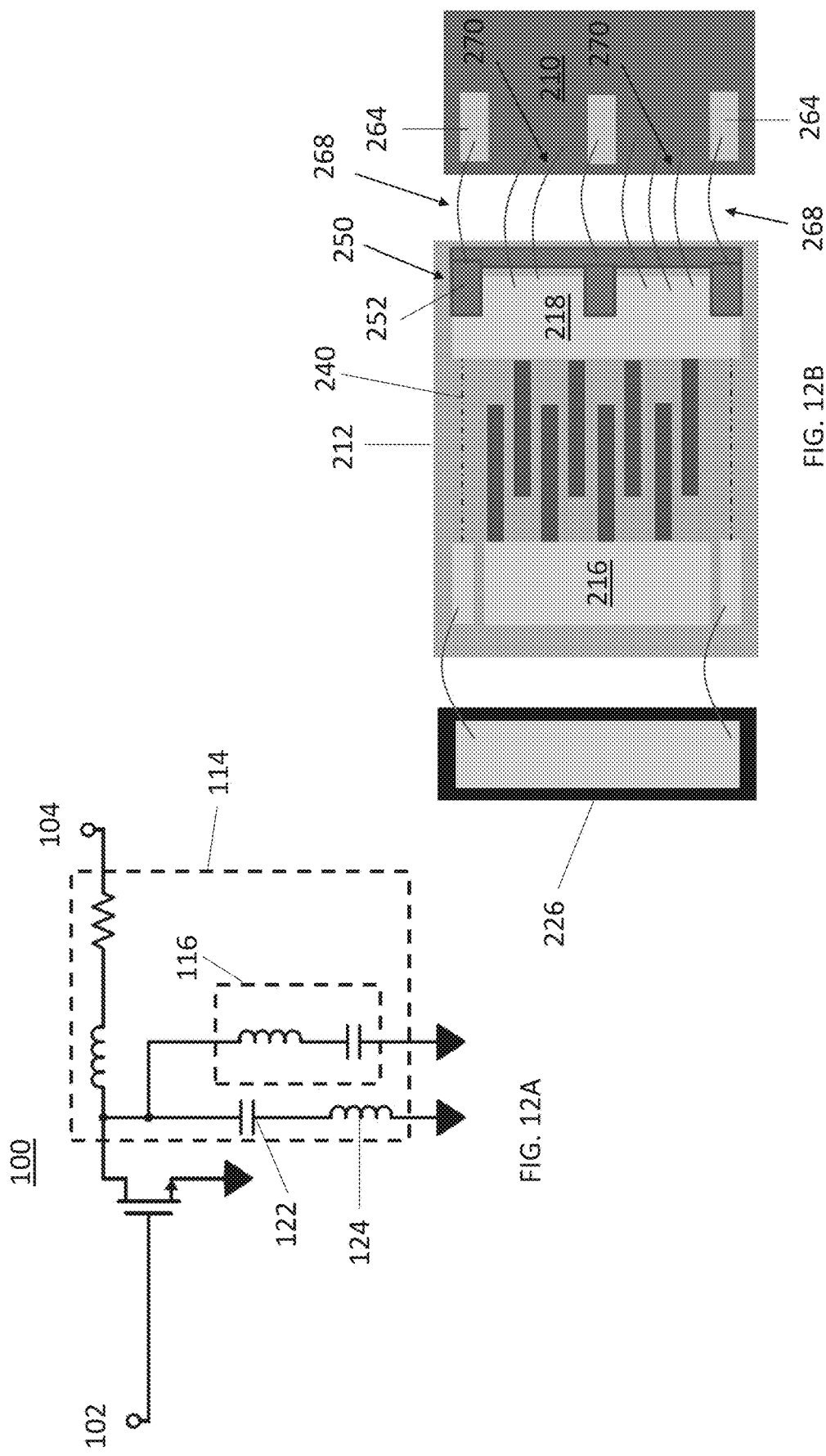

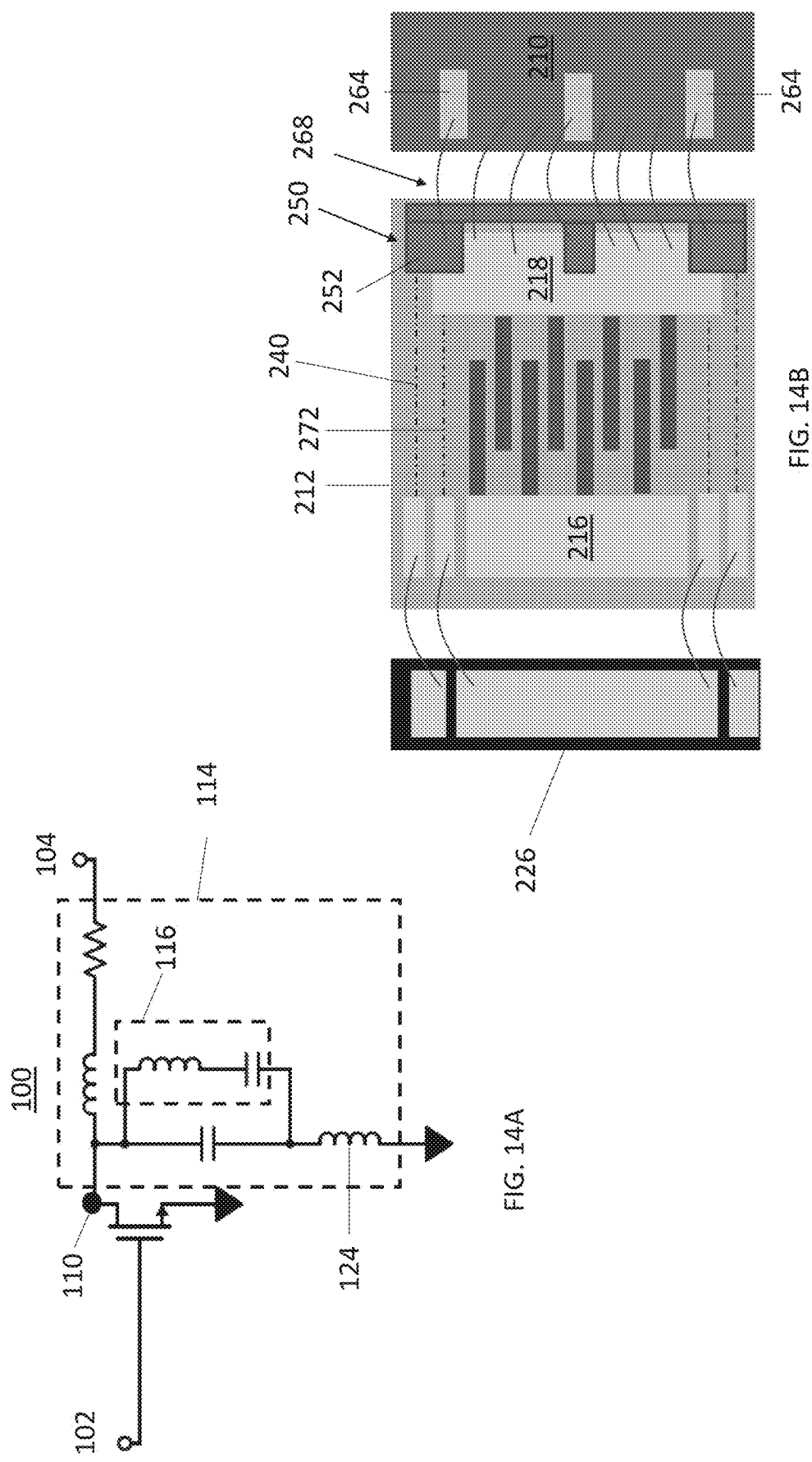

RF AMPLIFIER WITH IMPEDANCE MATCHING COMPONENTS MONOLITHICALLY INTEGRATED IN TRANSISTOR DIE

FIELD OF TECHNOLOGY

The present application relates to RF (radio frequency) amplifiers and in particular relates to impedance matching network designs for packaged RF amplifiers.

BACKGROUND

RF power amplifiers are used in a variety of applications such as base stations for wireless communication systems, etc. RF power amplifiers typically amplify a high frequency modulated carrier signal with frequencies range of 400 megahertz (MHz) to 60 gigahertz (GHz). A baseband signal that lies in frequency ranges below the carrier frequency, e.g., in the range of 100-500 MHz, is used to modulate the carrier signal thereby conveying information.

Many RF power amplifier designs utilize a semiconductor based integrated circuit as the amplification device. Examples of these switching devices include power transistor devices, such as a MOSFET (metal-oxide semiconductor field-effect transistor), a DMOS (double-diffused metal-oxide semiconductor) transistor, a GaN HEMT (gallium nitride high electron mobility transistor), a GaN MESFET (gallium nitride metal-semiconductor field-effect transistor), etc.

In addition to the power transistor device, many RF power amplifier designs include one or more impedance matching networks integrated into the amplifier package. An output impedance matching network can be provided at the output side of the package between the transistor output terminal (e.g., the drain) and the package second RF lead. Correspondingly, an input impedance matching network can be provided at the input side of the package between the transistor input terminal (e.g., the gate) and the package First RF Lead. A conventional function of these impedance matching networks is to match a characteristic impedance of the amplifier device (e.g., the input impedance or the output impedance) to a certain value for optimum power transfer. In addition, these impedance matching networks can be configured to filter higher order harmonics of the carrier signal to improve efficiency.

One drawback of known RF amplifier package designs is that a substantial amount of package area must be used between the die and package leads to accommodate passive components such as chip capacitors for the impedance matching networks. This space requirement moves the transistor die further away from the package lead, which results in longer bond wires. With a more complex impedance matching network, multiple bond wires that represent different electrical nodes are densely populated in the package. This causes unwanted parasitic effects including added resistance and mutual coupling which degrades the performance of the impedance matching network.

SUMMARY

A packaged amplifier circuit is disclosed. According to an embodiment, the packaged amplifier circuit includes an RF package having an electrically conductive die pad, an electrically conductive first RF lead extending away from the die pad, and an electrically conductive second RF lead extending away from the die pad in an opposite direction as the first RF lead. The packaged amplifier circuit further includes an RF transistor die mounted on the die pad such that a first outer edge side of the RF transistor die faces the first RF lead and a second outer edge side of the RF transistor die faces the second RF lead. The packaged amplifier circuit further includes a passive electrical connector integrally formed in the RF transistor die. The passive electrical connector includes a first end connection point disposed closer to the first outer edge side, and a second end connection point disposed closer to the second outer edge side. A first discrete reactive device is mounted on the die pad between the first outer edge side of the RF transistor die and the first RF lead. The passive electrical connector electrically couples the first discrete reactive device to the second RF lead.

According to another embodiment, the packaged amplifier circuit includes an RF package having an electrically conductive die pad, an electrically conductive first RF lead extending away from the die pad, and an electrically conductive second RF lead extending away from the die pad in an opposite direction as the first RF lead. The packaged amplifier circuit further includes an RF transistor die mounted on the die pad such that a first outer edge side of the RF transistor die faces the first RF lead and a second outer edge side of the RF transistor die faces the second RF lead. The RF transistor die includes an RF input terminal, an RF output terminal, and a reference potential terminal. A first capacitor is integrally formed in the RF transistor die. The first capacitor has first and second terminals. An output impedance matching network electrically couples the RF output terminal to the second RF lead. The first capacitor forms at least part of the output impedance matching network.

An RF transistor die is disclosed. According to an embodiment, the RF transistor die includes an upper side, a rear side opposite the upper side, and first and second outer edge sides that extend between the upper and rear sides and are arranged opposite one another. The RF transistor die further includes an electrically conductive RF input pad disposed on the upper side, an electrically conductive RF input pad disposed on the upper side, an electrically conductive RF output pad disposed on the upper side, a reference potential pad disposed on the lower side, and a passive electrical connector integrally formed in the RF transistor die and comprising first and second end connection points. The RF input pad and the RF output pad are separated from one another in a width direction of the RF transistor die, the width direction being perpendicular to the first and second outer edge sides. The first and second end connection points are separated from one another in the width direction of the RF transistor. The passive electrical connector is electrically isolated from the RF input pad.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A and 2B depicts a package implementation of the RF amplifier circuit illustrated in FIG. 1, according to an embodiment. FIG. 2A depicts a plan view of the RF package and FIG. 2B depicts a side view of the RF package.

FIG. 3, which includes FIGS. 3A and 3B, depicts an RF amplifier circuit, according to an embodiment. FIG. 3A depicts an equivalent circuit schematic of the RF amplifier circuit and FIG. 3B depicts a physical implementation of the RF amplifier circuit of FIG. 3A in an RF package, according to an embodiment.

FIG. 4, which includes FIGS. 4A and 4B, depicts an RF amplifier circuit, according to an embodiment. FIG. 4A depicts an equivalent circuit schematic of the RF amplifier circuit and FIG. 4B depicts a physical implementation of the RF amplifier circuit of FIG. 4A in an RF package, according to an embodiment.

FIG. 5, which includes FIGS. 5A and 5B, depicts an RF amplifier circuit, according to an embodiment. FIG. 5A depicts an equivalent circuit schematic of the RF amplifier circuit and FIG. 5B depicts a physical implementation of the RF amplifier circuit of FIG. 5A in an RF package, according to an embodiment.

FIG. 6, which includes FIGS. 6A and 6B, depicts an RF amplifier circuit, according to an embodiment. FIG. 6A depicts an equivalent circuit schematic of the RF amplifier circuit and FIG. 6B depicts a physical implementation of the RF amplifier circuit of FIG. 6A in an RF package, according to an embodiment.

FIG. 7, which includes FIGS. 7A and 7B, depicts an RF amplifier circuit, according to an embodiment. FIG. 7A depicts an equivalent circuit schematic of the RF amplifier circuit and FIG. 7B depicts a physical implementation of the RF amplifier circuit of FIG. 7A in an RF package, according to an embodiment.

FIG. 8, which includes FIGS. 8A and 8B, depicts an RF amplifier circuit, according to an embodiment. FIG. 8A depicts an equivalent circuit schematic of the RF amplifier circuit and FIG. 8B depicts a physical implementation of the RF amplifier circuit of FIG. 8A in an RF package, according to an embodiment.

FIG. 9, which includes FIGS. 9A and 9B, depicts an RF amplifier circuit, according to an embodiment. FIG. 9A depicts an equivalent circuit schematic of the RF amplifier circuit and FIG. 9B depicts a physical implementation of the RF amplifier circuit of FIG. 9A in an RF package, according to an embodiment.

FIG. 10, which includes FIGS. 10A and 10B, depicts an RF amplifier circuit, according to an embodiment. FIG. 10A depicts an equivalent circuit schematic of the RF amplifier circuit and FIG. 10B depicts a physical implementation of the RF amplifier circuit of FIG. 10A in an RF package, according to an embodiment.

FIG. 11, which includes FIG. 11A depicts an equivalent circuit schematic of the RF amplifier circuit and FIG. 11B depicts a physical implementation of the RF amplifier circuit of FIG. 11A in an RF package, according to an embodiment.

FIG. 12, which includes FIGS. 12A and 12B, depicts an RF amplifier circuit, according to an embodiment. FIG. 12A depicts an equivalent circuit schematic of the RF amplifier circuit and FIG. 12B depicts a physical implementation of the RF amplifier circuit of FIG. 12A in an RF package, according to an embodiment.

FIG. 13, which includes FIG. 13A depicts an equivalent circuit schematic of the RF amplifier circuit and FIG. 13B depicts a physical implementation of the RF amplifier circuit of FIG. 13A in an RF package, according to an embodiment.

FIG. 14, which includes FIGS. 14A and 14B, depicts an RF amplifier circuit, according to an embodiment. FIG. 14A depicts an equivalent circuit schematic of the RF amplifier circuit and FIG. 14B depicts a physical implementation of the RF amplifier circuit of FIG. 14A in an RF package, according to an embodiment.

DETAILED DESCRIPTION

According to embodiments described herein, a packaged RF amplifier circuit is disclosed. The packaged RF amplifier circuit includes an RF transistor die with monolithically integrated features that improve space efficiency and congestion in the impedance matching network of the packaged device. One of these features is a passive electrical connector that is integrally formed in an RF transistor die. The passive electrical connector provides a conductive connection across a width of the die. This allows passive components from the output impedance matching network, such as chip capacitors, to be relocated to an opposite side of the die where less congestion exists. Advantageously, the passive electrical connector can provide a defined inductance as part of the output impedance matching network. Another feature of the RF amplifier is a monolithically integrated capacitor that is integrally formed in the RF transistor die. This capacitor can have a bond pad that is close to or within a footprint of the drain pad and therefore can easily accessed by a bond wire in the output impedance matching network. The combined effect of the integrated passive electrical connector and the monolithically integrated capacitor is that RF transistor die can be placed immediately next to the output lead, while the package nonetheless includes a complete output impedance matching network connected between the die and the lead output lead.

Figure 1:
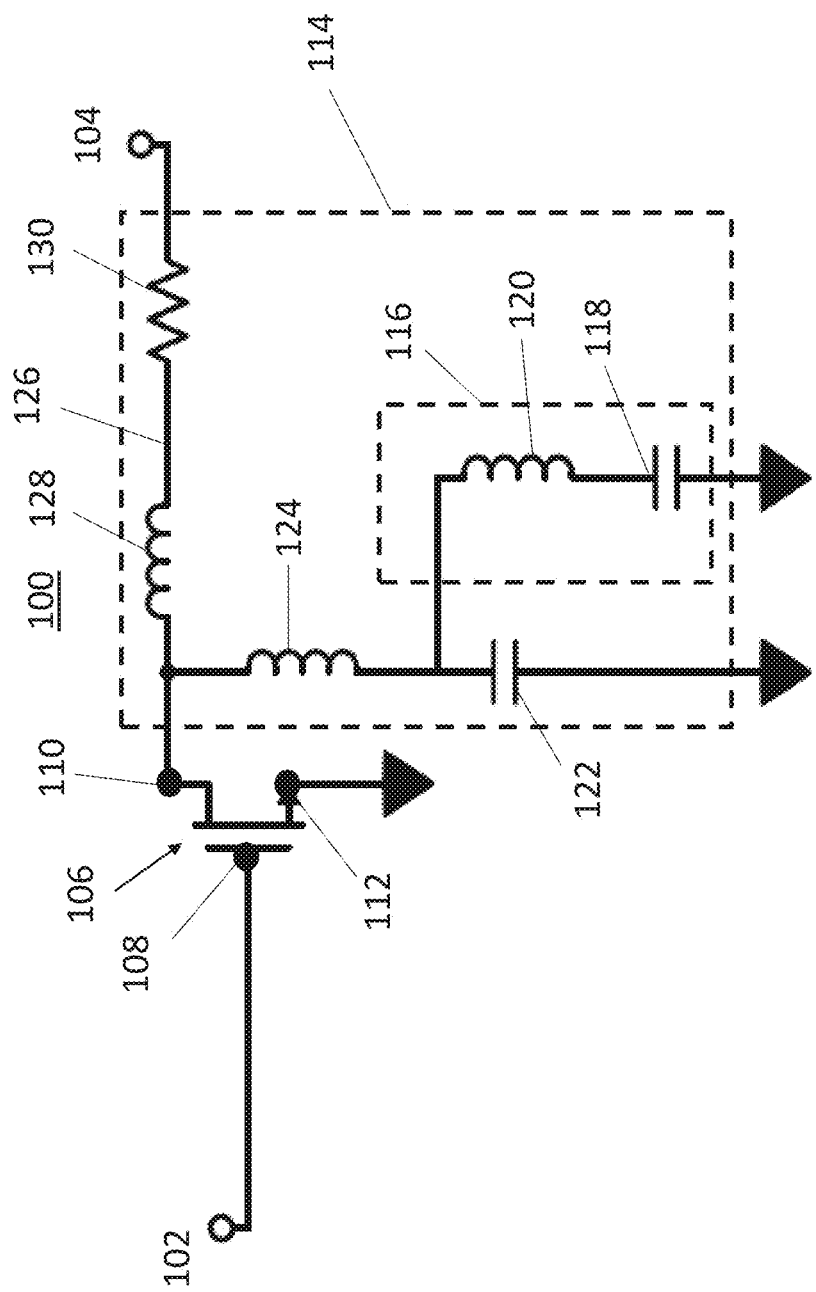
FIG. 1 depicts an equivalent circuit schematic of an RF amplifier circuit, according to an embodiment.

Referring to FIG. 1, an amplifier circuit 100 is schematically depicted, according to an embodiment. The amplifier circuit 100 is configured to amplify an RF signal as between an RF input port 102 and an RF output port 104. The amplifier circuit 100 can be a multi-carrier amplifier, a multiband amplifier, an LTE (long term evolution) compliant amplifier, a WCDMA (wideband code division multiple access) compliant amplifier, an 802.11(x) compliant amplifier, etc.

The amplifier circuit 100 includes an RF amplifier device 106. In this example, the RF amplifier device 106 is configured as a MOSFET transistor, wherein the RF signal is amplified between an RF input terminal 108 (i.e., the gate) and an RF output terminal 110 (i.e., the drain). The RF amplifier device 106 additionally includes a reference potential terminal 112 (i.e., the source) that is connected to a reference potential (e.g., GND). Generally speaking, the RF amplifier device 106 can be implemented with a variety of switching devices, such as such as a DMOS transistor, a GaN HEMT, or an LDMOS transistor, to name a few.

The amplifier circuit 100 is designed to provide amplification of an RF signal that lies in a fundamental frequency range. In one example, the fundamental RF frequency range is between 1.8 GHz and 2.2 GHz with a center frequency of 2.0 GHz. A baseband signal that represents a modulation frequency of the RF signal is 400 MHz. Second order harmonics of the RF signal lie in the range of 3.6 GHz to 5.4 GHz, with the second order harmonic of the center frequency being at 4.0 GHz. More generally, the principles described herein can be applied to a wide variety of different frequency ranges, including fundamental frequencies in the range of 100 MHz to 10 GHz and baseband frequencies in the range of several MHz to 500 MHz.

The amplifier circuit 100 includes an output impedance matching network 114 that is electrically coupled between the RF output terminal 110, the reference potential terminal 112 and the RF output port 104. The output impedance matching network 114 is a network of wires and reactive components that is configured to transfer an amplified version of the RF signal to the RF output port 104 in a power efficient manner.

The output impedance matching network 114 includes a first LC branch 116 that is connected in parallel with the RF output terminal 110 and the reference potential terminal 112 of the RF amplifier device 106. The first LC branch 116 includes a first capacitor 118 and a first inductor 120. The inductance and capacitance values of the first capacitor 118 and the first inductor 120 can be selected so that the first LC branch 116 resonates (i.e., appears as an RF short) at a desired frequency, thereby terminating signals in this frequency range. In this example, the first LC branch 116 is configured as a baseband termination circuit, wherein an inductance of the first inductor 120 and a capacitance of the first capacitor 118 are selected so that the first LC branch 116 resonates at a frequency at or near the baseband frequency range, e.g., about 400 MHz.

The output impedance matching network 114 additionally includes a second capacitor 122 connected in parallel with the RF output terminal 110 and the reference potential terminal 112 of the RF amplifier device 106. In this example, the second capacitor 122 is configured as a so-called DC shunt capacitor. According to this configuration, a capacitance of the second capacitor 122 is selected to provide a short-circuit path for low frequency signals (e.g., signals below 100 MHz in the case of a 1.8 GHz-2.2 GHz operating range) and DC signals.

The output impedance matching network 114 additionally includes a second inductor 124 connected in parallel with the RF output terminal 110 and the reference potential terminal 112 of the RF amplifier device 106. In this example, the second inductor 124 is an impedance matching component. In this configuration, the inductance value of the second inductor 124 is selected so that the second inductor 124 in combination with the transistor output capacitance of the MOSFET transistor (i.e., the drain-source capacitance) provide a resonant LC circuit at the center frequency of the fundamental RF frequency range.

The output impedance matching network 114 additionally includes a series branch 126 connected in series between the RF output terminal 110 of the RF amplifier device 106 and the RF output port 104. The series branch 126 is a wire connection that transfers the RF signal to the RF output port 104. The series branch 126 includes a third inductor 128 and a first resistor 130, which schematically represent parasitic effects of this wire connection.

Referring to FIG. 2, the amplifier circuit 100 as described with reference to FIG. 1 is physically implemented as a packaged RF amplifier 200. The packaged RF amplifier 200 includes a metal flange 202 that is configured to interface with another device, such as a printed circuit board. An electrically insulating window frame 204 is formed around the perimeter of the metal flange 202. A central portion of the metal flange 202 that is exposed from the window frame 204 provides an electrically conductive die pad 206 for the mounting of integrated circuit devices thereon. The die pad 206 provides the reference potential connection (e.g., GND) of the amplifier circuit 100. As the metal flange 202 can include a thermally and electrically conductive material (e.g., copper, aluminum, etc.), it can be configured as a heat sink that is configured to carry heat away from the integrated circuit devices mounted thereon.

An electrically conductive first RF lead 208 extends away from the die pad 206, and an electrically conductive second RF lead 210 extends away from the die pad 206 in an opposite direction as the first RF lead 208. The first RF lead 208 and second RF lead 210 provide the RF input port 102 and the RF output port 104, respectively, of the amplifier circuit 100. The window frame 204 insulates the first RF lead 208 and second RF lead 210 from the metal flange 202.

An RF transistor die 212 is mounted on the die pad 206. This RF transistor die 212 provides the RF amplifier device 106 as previously described in the amplifier circuit 100 of FIG. 1. In this example, the RF transistor die 212 is a vertical transistor device.

An upper side 214 of the RF transistor die 212 that is opposite from the die pad 206 includes first and second electrically conductive bond pads 216, 218. The first bond pad 216 provides the RF input terminal 108 and the second bond pad 218 provides the RF output terminal 110 of the RF amplifier device 106. A lower side of the RF transistor die 212 that faces the die pad 206 includes a third electrically conductive bond pad 220. The third bond pad 220 provides the reference potential terminal 112 of the RF amplifier device 106.

The RF transistor die 212 includes first and second outer edge sides 222, 224, which are chip edge sides extending between the upper side 214 and the lower side of the RF transistor die 212. The first and second outer edge sides 222, 224 are arranged opposite one another. The RF transistor die 212 is mounted on the die pad 206 such that the first outer edge side 222 faces the first RF lead 208 and the second outer edge side 224 faces the second RF lead 210. The first bond pad 216 is disposed closer to the first outer edge side 222 than the second outer edge side 224 and the second bond pad 218 is disposed closer to the second outer edge side 224 than the first outer edge side 222. Hence, the RF transistor die 212 is oriented so that the first and second bond pads 216, 218 are disposed closer to the package leads to which they are connected to.

The output impedance matching network 114 is provided by a network of bond wires and discrete reactive components. In more detail, the packaged amplifier includes a first chip capacitor 226 which provides the first capacitor 118 of the output impedance matching network 114 and a second chip capacitor 228 which provides the second capacitor 122 of the output impedance matching network 114. The first and second chip capacitors 226, 228 are discrete devices with bond pads that are provided on opposite facing upper and lowersides of these devices and provide the terminals of these capacitors.

The first inductor 120 of the output impedance matching network 114 is provided by a first group 230 of electrically conductive bond wires that are directly connected between the upward facing bond pad of the first chip capacitor 226 and the upward facing bond pad of the second chip capacitor 228. The second inductor 124 of the output impedance matching network 114 is provided by a second group 232 of electrically conductive bond wires that are directly connected between the second bond pad 218 of the RF transistor die 212 and the upward facing bond pad of the second chip capacitor 228. The series branch 126 of the output impedance matching network 114 is provided by a third group 234 of bond wires. As those of ordinary skill will appreciate, there is an inductance associated with any bond wire connection. The necessary inductance values of the output impedance matching network 114 as described above can be realized by tailoring the physical parameters of the bond wires in the first, second and third groups 230, 232 and 234. These physical parameters include height of the bond wires, separation distance between the bond wires, length of the spans of the bond wires, etc.

One drawback of the packaged RF amplifier 200 depicted in FIG. 2 is that the discrete components of the output impedance matching network 114 occupy a substantial amount of area between the second outer edge side 224 of the RF transistor die 212 and the second RF lead 210, i.e., at the drain side of the device. This area requirement of the output impedance matching network 114 moves the RF transistor die 212 further away from the second RF lead 210. As a consequence, the parasitic inductance and resistance of the series branch 126 is increased. Moreover, the close congestion of the components and bond wires in the output impedance matching network 114 results in significant mutual electromagnetic coupling between the various bond wires of the different groups 230, 232 and 234. These effects must be accounted for and require recalibration of the various components. This problem constrains the efficacy of the output impedance matching network 114 and limits the ability to add additional filtering/blocking circuitry into the output impedance matching network 114.

Referring to FIG. 3, an RF amplifier circuit 100 with beneficial features that mitigate the above described issues relating to the space requirements and bond wire crowding of the output impedance matching network 114 is depicted.

FIG. 3A depicts an amplifier circuit 100 having the same topology as the amplifier circuit 100 described with reference to FIG. 1. Moreover, the parameter values of the various components of the output impedance matching network 114 are the same as those values previously described.

FIG. 3B depicts a partial view of a physical implementation of the amplifier circuit 100 as a packaged device. In this view, only some of the components are shown for simplicity sake. In particular, the RF transistor die 212, the output impedance matching network 114 and the second RF lead 210 are shown. This arrangement can be implemented in a complete package including the flange 202, die pad 206 and first RF lead 208 as depicted in FIG. 2.

According to an embodiment, the RF transistor die 212 is a MOSFET (metal-oxide semiconductor field-effect transistor) device. Alternatively, the RF transistor die 212 can be a DMOS (double-diffused metal-oxide semiconductor) transistor, a GaN HEMT (gallium nitride high electron mobility transistor), a GaN MESFET (gallium nitride metal-semiconductor field-effect transistor), an LDMOS transistor, etc., and more generally any type of RF transistor device.

In this embodiment, the RF transistor die 212 includes a first set 236 of elongated fingers that extend from the first bond pad 216 towards the second outer edge side 224 of the RF transistor die 212. The first set 236 of elongated fingers can be so-called gate fingers, which are interconnect level conductive tracks (e.g., polysilicon tracks) which provide the gate of the device. The RF transistor die 212 additionally includes a second set 238 of elongated fingers that extend from the second bond pad 218 towards the first outer edge side 222 of the RF transistor die 212. The second set 238 of elongated fingers can be so-called drain fingers, which are interconnect level conductive tracks (e.g., polysilicon tracks) which provide the drain connection of the device.

This embodiment differs from the embodiment of FIG. 2 in that the first chip capacitor 226 (i.e., the first capacitor 118 of the output matching network 114) is moved to the opposite side of the RF transistor die 212. That is, the first chip capacitor 226 is mounted on the die pad 206 between the first outer edge side 222 of the RF transistor and the first RF lead 208. As a result, the RF transistor die 212 can be moved closer to the second RF lead 210 and hence the length of the bond wire connections and the congestion of bond wires at the drainside of the package is reduced.

The advantageous relocation of the first chip capacitor 226 is facilitated by a passive electrical connector 240 that is incorporated into the RF transistor die 212. The passive electrical connector 240 provides a low-ohmic (i.e., electrically conductive) connection between a first end connection point 242 that is disposed closer to the first outer edge side 222 of the RF transistor die 212 and a second end connection point 244 disposed closer to the second outer edge side 224 of the RF transistor die 212. In other words, the passive electrical connector 240 provides an electrical transmission path across at least a portion of width of the RF transistor die 212, thereby providing a connection mechanism for accessing a node in the output impedance matching network 114 from the opposite side of the RF transistor die 212. The connector is passive in the sense that the low-ohmic connection is provided automatically upon the application of a voltage between the first and second connection points 242, 244 and is not dependent upon the presence or lack thereof of a separate control signal.

The passive electrical connector 240 is integrally formed in the RF transistor die 212. This means that the passive electrical connector 240 is incorporated into the structure of the RF transistor die 212. Generally speaking, a variety of different configurations are possible. For example, the passive electrical connector 240 can be formed on an upper level of metallization of the RF transistor die 212 that is also used to form the first and second bond pads 216, 218. Alternatively, at least a portion of the passive electrical connector 240 can be formed in lower level metallization layers that are not exposed, including interconnect levels. Alternatively, or in addition, at least a portion of the passive electrical connector 240 can be formed in the semiconductor body of the RF transistor die 212, e.g., by highly doped semiconductor regions. The passive electrical connector 240 can include a conductive trace that extends parallel to the gate and drain fingers between the first and second connection points 242, 244.

According to an embodiment, the passive electrical connector 240 is electrically isolated from the RF input terminal of the RF transistor die 212, i.e., the first bond pad 216 and associated gate fingers. This means that the first and second connection points 242, 244 provide a distinct electrical node from the RF input terminal and all components of the passive electrical connector 240 including bond pads and lower level metallizations are internally electrically insulated from the RF input terminal 108.

In the depicted embodiment, the first and second connection points 242, 244 of the passive electrical connector 240 are provided by fourth and fifth electrically conductive bond pads, 246, 248 respectively. Both of these bond pads 246, 248 are formed on the upper side 214 of the semiconductor die and are physically distinct and separate from the first and second bond pads 216, 218.

In the depicted embodiment, the fourth bond pad 244 (and hence the first connection point 242) is disposed immediately adjacent to the first outer edge side 222. This means that no other intentionally formed structures are provided between the fourth bond pad 244 and the first outer edge side 222. In a particular example of this configuration, the fourth bond pad 244 is disposed as close to the first outer edge side 222 as is practically achievable, i.e., at the minimum design rule distance. Correspondingly, the fifth bond pad 248 (and hence the second connection point 244) can be disposed immediately adjacent to the second outer edge side 224 and, in a particular embodiment, as close to the second outer edge side 224 as is practically achievable. This configuration provides a passive electrical connector 240 which spans across substantially the entire width of the RF transistor die 212.

More generally, the passive electrical connector 240 can have any configuration wherein the first and second connection points 242, 244 are separated from one another in a width direction of the RF transistor die 212. The width direction of the RF transistor die 212 is perpendicular to the first and second outer edge sides 222, 224. This configuration produces an electrical conduit between a gate side of the RF transistor die 212 and the drain side of the RF transistor die 212. In an embodiment, the first and second connection points 242, 244 are separated from one another by at least half of the width of the RF transistor die 212.

The passive electrical connector 240 in combination with the first chip capacitor 226 provide the first LC branch 116 of the output impedance matching network 114. The passive electrical connector 240 can be configured to provide at least some of the inductance of the first inductor 120. In various embodiments, the passive electrical connector 240 can provide a substantial majority of the inductance of the first inductor 120, i.e., two thirds of the inductance of the first inductor 120 or more. A desired inductance of the passive electrical connector 240 can be achieved by appropriately tailoring the physical layout of the passive electrical connector 240 within the RF transistor die 212. For example, the passive electrical connector 240 can include one or more conductive traces that are connected between the first and second connection points 242, 244 and are physically structured to provide the characteristic of an inductor, e.g., using known waveguide or mictrostripline techniques. These conductive traces can be formed in any layer of metallization. The additional bond wires that form part of the electrical connection between the first capacitor 118 and the second bond wire may also contribute to the inductance of the first LC branch 116 and can be tailored accordingly.

Referring to FIG. 4, an RF amplifier circuit 100 is depicted, according to another embodiment. The circuit topology of FIG. 4A differs from the circuit topology of FIG. 3A in that the first LC branch 116 of the output impedance matching network 114 directly connects to the RF output terminal 110 instead of the node between the second capacitor 122 and the second inductor 124.

As shown in FIG. 4B, in this embodiment, the passive electrical connector 240 directly connects to the second bond pad 218. As a result, the second bond pad 218 provides the second end connection point 244 of the passive electrical connector 240. The direct connection between the passive electrical connector 240 and the second bond pad 218 is internal to the RF transistor die 212. This means that no external bond wires are used to complete this electrical connection. In various embodiments, this direct electrical connection can be completed at the upper level of metallization and/or lower levels from within the RF transistor die 212. One advantage of this configuration in comparison to the embodiment of FIG. 3B is the elimination of the bond wire between the passive electrical connector 240 and the second capacitor 122.

Referring to FIG. 5, an RF amplifier circuit 100 is depicted, according to another embodiment. Different to the topology of FIG. 4A, the amplifier circuit 100 of FIG. 5A is configured such that the first LC branch 116 directly connects to the RF output port 104 instead of the RF output terminal 110.

Referring to FIG. 5B, this embodiment differs from the previous embodiments in that the second capacitor 122 is incorporated into the RF transistor die 212 as a first monolithically integrated capacitor 250. The first monolithically integrated capacitor 250 is an integrally formed component of the RF transistor die 212. This means that the RF transistor die 212 includes, in addition to the components of a transistor, a separate capacitor structure that is formed in the semiconductor body and/or associated metallization layers formed on the semiconductor body. The first monolithically integrated capacitor 250 includes first and second terminals that are accessible for electrical connection. According to an embodiment, the first terminal of the first integrally formed capacitor is provided by a sixth electrically conductive bond pad 252 that is disposed on the upper side 214 of the RF transistor die 212. The sixth bond pad 252 is, in the absence of external electrical connection, electrically isolated from the other bond pads of the RF transistor die 212. The sixth bond pad 252 can be arranged close to the second outer edge side 224 of the RF transistor die 212 to enable easy electrical access by a short bond wire at the drain side of the package, i.e., between the second outer edge side 224 and the second RF lead 210. To this end, the sixth bond pad 252 can be disposed within the footprint of the second bond pad 218 as shown. More generally, the sixth bond pad 252 can at least partially overlap with or align with the second bond pad 218 so that both bond pads are disposed closer to the second outer edge side 224.

The second terminal of the first monolithically integrated capacitor 250 can be provided by a bond pad (not shown) disposed on the rear side of the RF transistor die 212 that faces and directly connects to the die pad 206. In an embodiment, this bond pad can be common to the third bond pad 220 as previously described which provides the reference potential terminal 112 of the RF transistor die 212.

One or more first bond wires 254 is connected between the sixth bond pad 252 or pads and the second RF lead 210. These first bond wires 254 bond wires provide the second inductor 124 of the output matching impedance network 114 as previously described. One or more second bond wires 256 is connected between the RF output terminal 110 and the second RF lead 210. These second bond wires 256 provide the series branch 126 of the output matching impedance network 114 as previously described.

Advantageously, the configuration of FIG. 5 further reduces the area required for the output impedance matching network 114 at the output side of the RF transistor die 212, i.e., between the second outer edge side 224 of the RF transistor die 212 and the second RF lead 210. In fact, by combining the features of the passive electrical connector 240 and the first monolithically integrated capacitor 250, the RF transistor die 212 can be located immediately adjacent to the second RF lead 210. This means that no discrete components are disposed between the RF transistor die 212 and the second RF lead 210. Consequently, the parasitic inductance and resistance of the bond wire connections, and particularly the series branch 126 of the output impedance matching network 114, is advantageously reduced.

Referring to FIG. 6, a packaged amplifier circuit 100 is depicted, according to another embodiment. The amplifier circuit 100 of FIG. 6A has the same circuit topology as the circuit topology described with reference to FIG. 4A.

Referring to FIG. 6B, the first bond wires 254 are directly connected between the sixth bond pad 252 and the second bond pad 218. The first bond wires 254 provide the electrical connection between the first LC branch 116 and the RF output terminal 110. The second bond wires 256 are directly connected between the second bond pad 218 and the second RF lead 210. The second bond wires 256 provides the series connection 126 of the output impedance matching network 114 as previously described.

In this embodiment, the first and second bond wires 254, 256 are oriented transverse to one another. This means the first bond wires 254 extend in a direction that crosses with a direction of extension of the second bond wires 256. As shown, the first bond wires 254 extend in a direction that is substantially parallel to the second outer edge side 224 (i.e., +/−fifteen degrees of exactly parallel), whereas the second bond wires 256 extend in a direction that is roughly perpendicular to the second outer edge side 224 (i.e., +/−fifteen degrees of exactly perpendicular). By orienting the first and second bond wires 254, 256 to be at least substantially transverse to one another, mutual electromagnetic coupling between these bond wires is substantially mitigated in comparison to configurations in which these bond wires are parallel to one another. Generally speaking, the first and second bond wires 254, 256 are substantially transverse when their respective directions of extensions are within +/−twenty degrees of exactly perpendicular to one another.

Referring to FIG. 7, a packaged amplifier circuit 100 is depicted, according to another embodiment. The amplifier circuit 100 of FIG. 7A differs from previous embodiments in that the second inductor 124 connects directly to the RF output port 104 and the first LC branch 116 is directly connected to a node between the second inductor 124 and the second capacitor 122.

Referring to FIG. 7B, the passive electrical connector 240 connects directly to the sixth bond pad 252 and hence connects the first LC branch 116 directly to the first terminal of the first monolithically integrated capacitor 250. The direct connection between the passive electrical connector 240 and the sixth bond pad 252 is internal to the RF transistor die 212. This means that no external bond wires are used to complete this electrical connection. In various embodiments, this direct electrical connection can be completed at the upper level of metallization or at metallization and/or semiconductor levels from within the RF transistor die 212. Moreover, in this configuration, the upper side 214 of the RF transistor die 212 includes a conductive strip 258 in the upper level of metallization which connects multiples ones of the sixth bond pads 252 together.

The sixth bond pad 252 is electrically connected to the second RF lead 210 by one or more first bond wires 254, which are configured to provide the second inductor 124 of the output matching network. The second bond pad 218 is electrically connected to the second RF lead 210 by one or more second bond wires 256, which provide the series branch 126 of the output matching network.

Referring to FIG. 8, a packaged amplifier circuit 100 is depicted, according to another embodiment. The amplifier circuit 100 of FIG. 8A has the same circuit topology as the circuit topology described with reference to FIG. 3A.

Referring to FIG. 8B, the bond wire configuration of the packaged amplifier circuit 100 is modified in comparison to the configuration of FIG. 7B. In this configuration, the first and second bond wires 254, 256 are oriented transverse to one another in a similar configuration as previously described with reference to FIG. 6. Thus, mutual electromagnetic coupling between the two groups of bond wires is beneficially mitigated in a similar manner as previously discussed.

Referring to FIG. 9, a packaged amplifier circuit 100 is depicted, according to another embodiment. The amplifier circuit 100 of FIG. 9A has the same topology as the amplifier circuit 100 of FIG. 8 except that it additionally includes a second LC branch 132 in parallel with the RF output terminal 110 and the reference potential terminal 112 of the amplifier device. The second LC branch 132 is directly connected to the RF output port 104 and includes a third capacitor 134 and a third inductor 136. The second LC branch 132 provides an additional branch in the output impedance matching network 114 for selectively filtering desired frequencies. For example, the second LC branch 132 can be configured to resonate at higher order harmonics of frequencies lying within the fundamental RF frequency range such as the second order harmonic of the center frequency, the fourth order harmonic of the center frequency, etc.

Referring to FIG. 9B, the second LC branch 132 is provided by a second monolithically integrated capacitor 258 in the RF transistor die 212. The second monolithically integrated capacitor 258 forms the third capacitor 134 of the output impedance matching network 114 of FIG. 9A. The second monolithically integrated capacitor 258 is an integral component of the RF transistor die 212 and can have a similar structure as the first monolithically integrated capacitor 250 as previously described. A first terminal of the second monolithically integrated capacitor 258 is provided by a seventh electrically conductive bond pad 260 that is enclosed within the third bond pad 220. This arrangement is just one example and, more generally, the seventh bond pad 260 can be arranged anywhere on the upper surface of the RF transistor die 212. A second terminal of the second monolithically integrated capacitor 258 can be provided by the second bond pad 220 at the rear surface of the RF transistor die 212. The third inductor 136 of the output impedance matching network 114 is provided by one or more third bond wires 262 that are directly connected between the seventh bond pad 260 and the second RF lead 210.

The concept of FIG. 9 can be extended to provide additional LC filtering branches in the amplifier circuit 100 by providing additional monolithically integrated capacitors and inductive bond wire connections in a similar manner. Alternatively, multiple monolithically integrated capacitors can be connected together in a single LC branch if additional capacitance is desired.

Referring to FIG. 10, a packaged amplifier circuit 100 is depicted, according to another embodiment. The amplifier circuit 100 of FIG. 10A has the same circuit topology as the circuit topology described with reference to FIG. 3A.

Referring to FIG. 10B, the configuration of the second RF lead 210 is modified in comparison to previously disclosed designs. In this embodiment, the second RF lead 210 includes a plurality of electrically isolated and electrically conductive bond pads 264. Each of these bond pads 264 provide a distinct electrical node that is unconnected to the second RF lead 210 and hence independent from the RF signal being amplified. In this embodiment, the bond pads 264 are electrically floating. These bond pads 264 provide an alternate mechanism for electrically connecting the first monolithically integrated capacitor 250 to the second bond pad 218. This electrical connection includes fourth electrically conductive bond wire or wires 266 that are directly connected between different ones of the electrically isolated bond pads 264 on the second RF lead 210. This configuration advantageously allows a substantial portion of the inductance of the second inductor to be provided by the fourth bond wires 266, which are advantageously located away from the other bond wires. This provides various advantages, such as a potential reduction in the size of the second bond pad 218 and mitigation of electromagnetic coupling between the bond wires.

Figures 11A, 11B:
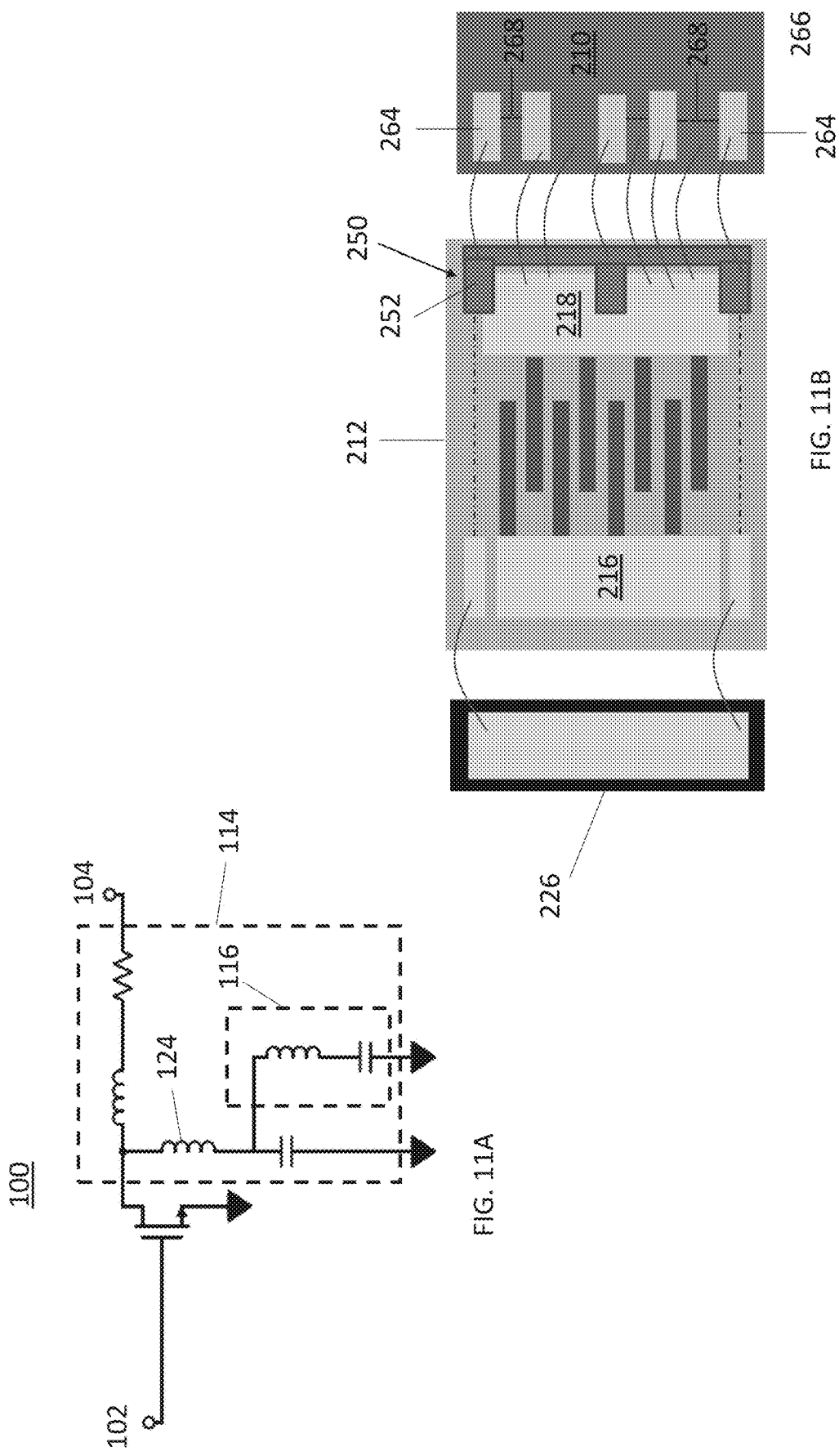
FIGS. 11A and 11B, depicts an RF amplifier circuit, according to an embodiment.

Referring to FIG. 11, a packaged amplifier circuit 100 is depicted, according to another embodiment. The amplifier circuit 100 of FIG. 11A has the same circuit topology as the circuit topology described with reference to FIG. 3A.

Referring to FIG. 11B, the packaged amplifier circuit 100 is identical to the packaged amplifier circuit 100 of FIG. 10, except that the fourth bond wires 266 are replaced by internal electrical connectors 268 that are integrally formed within the second RF lead 210. These internal electrical connectors 268 can be configured as inductors and can be tailored to provide at least some of the inductance of the second inductor 124. One example of a package design that can be configured in this manner is described in U.S. Pat. No. 9,629,246 to Mu, the contents of which are incorporated by reference herein in their entirety. To summarize, according to this design, the package leads are made from a PCB like structure that includes multiple levels of metallization and a dielectric between the metallization. This enables the formation of electrical signal lines within the package leads, wherein the physical features of the electrical signal lines can be tailored to provide desired electrical properties.

Referring to FIG. 12, a packaged amplifier circuit 100 is depicted, according to another embodiment. The circuit of FIG. 12A has the same circuit topology as the circuit topology described with reference to FIG. 4A, except that the position of the second inductor 124 and second capacitor 122 has been reversed so that the second inductor 124 is connected between the reference potential terminal 112 and the second capacitor 122, and the second capacitor 122 is connected between the second inductor 124 and the RF output terminal 110.

Referring to FIG. 12B, the second RF lead 210 includes a plurality of electrically isolated bond pads 264 formed in the second RF lead 210 in a similar manner as described above. One or more fifth electrically conductive bond wires 268 is directly connected between the sixth bond pads 252 the electrically isolated bond pads 264. In this embodiment, the sixth bond pads 252 are connected to the reference potential and hence connect the fifth bond wires 268 to the reference potential. One or more sixth electrically conductive bond wires 270 is directly connected between the second RF lead 210 and the second bond pad 218. The fifth and sixth bond wires 268, 270 provide the second inductor 124 of the output impedance matching circuit 114. In this configuration, the passive electrical connector 240 is directly connected to the second bond pad 218 in a similar manner as previous described.

Figures 13A, 13B:
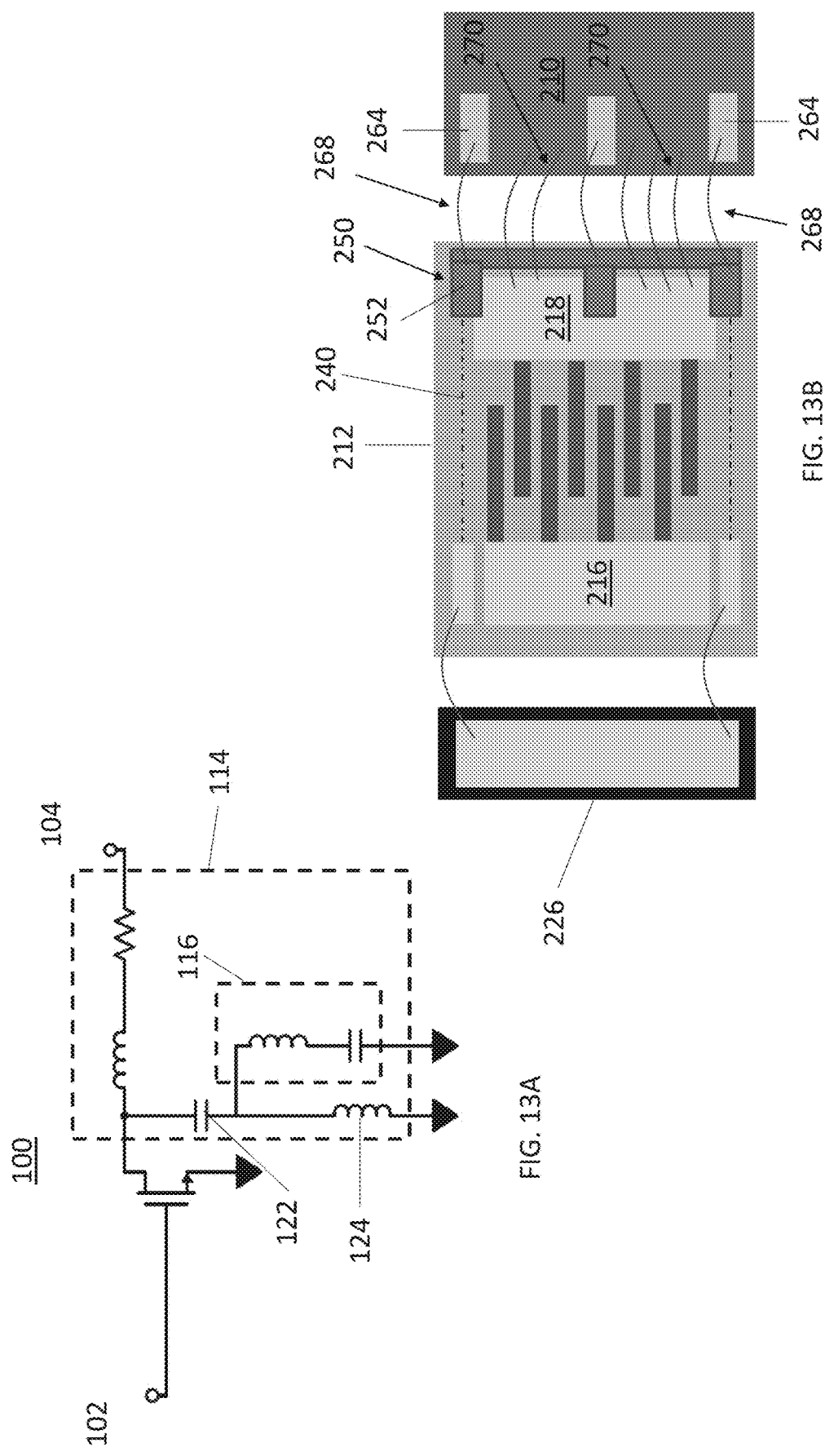
FIGS. 13A and 13B, depicts an RF amplifier circuit, according to an embodiment.

Referring to FIG. 13, a packaged amplifier circuit 100 is depicted, according to another embodiment. The amplifier circuit 100 of FIG. 13A has the same circuit topology as the circuit topology described with reference to FIG. 12A, except that the first LC branch 116 connects directly to the node that is between the second capacitor 122 and the second inductor 124 instead of to the RF output terminal 110.

Referring to FIG. 13B, the RF transistor die 212 is modified from the embodiment of FIG. 12B such that the passive electrical connector 240 directly connects to the sixth bond pad 252 in a similar manner as described in previous embodiments, such as the embodiment of FIG. 11. This provides the direct connection between the first LC branch 116 and the node that is between the second capacitor 122 and the second inductor 124.

Referring to FIG. 14, a packaged amplifier circuit 100 is depicted, according to another embodiment. In the circuit of 14A, the second capacitor 122 and the second inductor 124 are configured in a similar manner as the circuit of FIG. 13A. The connection points of the first LC branch 116 are modified such first LC branch 116 connects directly to the RF output terminal 110 and to the node between the second capacitor 122 and the second inductor 124. That is, the first LC branch 116 forms a parallel circuit with the second capacitor 122.

Referring to FIG. 14B, the direct connection between the first LC branch 116 and the node between the second capacitor 122 and the second inductor 124 is provided by a first passive electrical connector 240. The connection between the first capacitor 118 and the RF output terminal 110 is provided by a second passive electrical connector 272 that is directly connected to the second bond pad 218 by an internal connection of the RF transistor die 212. The second passive electrical connector 272 can be configured in a similar identical manner as the passive electrical connector 240 previously described. In this case, both of the terminals of the first capacitor 118 are provided on an upper side of the first chip capacitor 226.

The above discussed output impedance matching network 114 configuration represents just one example of a variety of output impedance matching network 114 configurations for an RF amplifier circuit 100. More generally, the concepts described herein can apply to a variety of different circuit topologies and/or differently selected reactance values than those discussed above. In various designs, these output impedance matching networks can include a variety of different reactive components (e.g., inductors, capacitors, radial stubs, baluns, etc.) that are configured to provide filtering or blocking of RF frequencies in the baseband frequency range, the fundamental frequency range, and at higher order harmonics of the fundamental frequency, for example. Moreover, while the RF amplifier circuit 100 described herein only includes an output impedance matching network 114, corresponding design considerations may be used for an input impedance matching circuit at the input side of the amplifier circuit 100, i.e., between the first input port and the RF input terminal 108. The features described herein including, but not limited to, the passive electrical connector 240, the integrated capacitors and the various bond wire configurations can be implemented in such an input impedance matching circuit.

The passive electrical connector 240 and the monolithically integrated capacitors described herein can be implemented in a variety of different circuit configurations and/or circuit topologies other than the ones described above. For instance, the passive electrical connector 240 and/or monolithically integrated capacitors be part of an LC circuit that provides filtering or blocking of RF frequencies in the baseband frequency range, the fundamental frequency range, and at higher order harmonics of the fundamental frequency, for example.

In an embodiment of a packaged amplifier circuit that can be combined with others, the packaged amplifier circuit includes an RF package comprising an electrically conductive die pad, an electrically conductive first RF lead extending away from the die pad, and an electrically conductive second RF lead extending away from the die pad in an opposite direction as the first RF lead, an RF transistor die mounted on the die pad such that a first outer edge side of the RF transistor die faces the first RF lead and a second outer edge side of the RF transistor die faces the second RF lead, and a passive electrical connector integrally formed in the RF transistor die, the passive electrical connector comprising: a first end connection point disposed closer to the first outer edge side, and a second end connection point disposed closer to the second outer edge side, and a first discrete reactive device mounted on the die pad between the first outer edge side of the RF transistor and the first RF lead, and the passive electrical connector electrically couples the first discrete reactive device to the second RF lead.

In an embodiment of the packaged amplifier circuit that can be combined with others, the RF transistor die comprises an RF input terminal, an RF output terminal, and a reference potential terminal, and the passive electrical connector is electrically isolated from the RF input terminal.

In an embodiment of the packaged amplifier circuit that can be combined with others, the packaged amplifier circuit further comprises an output impedance matching network that is electrically connected to the second RF lead, the RF output terminal and the reference potential terminal, and the first discrete reactive device and the passive electrical connector form at least part of the output impedance matching network.

In an embodiment of the packaged amplifier circuit that can be combined with others, the RF transistor is configured to amplify an RF signal as between the RF input terminal and the RF output terminal across a fundamental RF frequency range, the passive electrical connector and the first discrete reactive device collectively provide a first LC branch of the output impedance matching network, the first LC branch is connected in parallel with the RF output terminal and the reference potential terminal, and the first LC branch is configured to resonate at a frequency that is below the fundamental RF frequency range.

In an embodiment of the packaged amplifier circuit that can be combined with others, the first discrete reactive device is a chip capacitor, and the inductance of the first LC branch is substantially provided an inductance of the passive electrical connector.

In an embodiment of the packaged amplifier circuit that can be combined with others, the RF transistor die further comprises a rear side facing the die pad, an upper side facing away from the die pad, first, second, and fourth bond pads disposed on the upper side, a third bond pad disposed on the rear side, the first and fourth bond pads are disposed closer to the first outer edge side than the second outer edge side, the second bond pad is disposed closer to the second outer edge side than the first outer edge side, the first bond pad provides the RF input terminal, the second bond pad provides the RF output terminal, the third bond pad provides the reference potential terminal, and the fourth bond provides the first end connection point.

In an embodiment of the packaged amplifier circuit that can be combined with others, the passive electrical connector is internally connected within the RF transistor die to the second bond pad, and the second bond pad provides the second end connection point.

In an embodiment of the packaged amplifier circuit that can be combined with others, the RF transistor die comprises a fifth electrically conductive bond pad disposed on the upper side closer to the second outer edge side than the first outer edge side, and the fifth bond pad provides the second end connection point.

In an embodiment of the packaged amplifier circuit that can be combined with others, the packaged amplifier circuit further comprises a second discrete reactive device mounted on the die pad between the second outer edge side of the RF transistor die and the second RF lead, the second discrete reactive device forms part of the output impedance matching network, and the second discrete reactive device is directly connected to the second end connection point of the passive electrical connector In an embodiment of the packaged amplifier circuit that can be combined with others, the packaged amplifier circuit further comprises a first monolithically integrated capacitor that is integrally formed within the RF transistor die, wherein the first monolithically integrated capacitor forms part of the output impedance matching network, and wherein a first terminal of the first monolithically integrated capacitor is provided by a sixth bond pad that is disposed on the upper side.

In an embodiment of the packaged amplifier circuit that can be combined with others, the passive electrical connector electrically is internally connected within the RF transistor die to the third bond pad, the third bond pad provides the second end connection point, and the third bond pad is electrically connected to the sixth bond pad by one or more electrically conductive bond wires.

In an embodiment of the packaged amplifier circuit that can be combined with others, the passive electrical connector electrically is internally connected within the RF transistor die to the sixth bond pad, and the sixth bond pad provides the second end connection point.

In an embodiment of the packaged amplifier circuit that can be combined with others, the RF transistor die is immediately adjacent to the second RF lead such that a space between the second edge side of the RF transistor die and the second RF lead is devoid of discrete components.

In an embodiment of a packaged amplifier circuit that can be combined with others, the packaged amplifier circuit includes an RF package comprising an electrically conductive die pad, an electrically conductive first RF lead extending away from the die pad, and an electrically conductive second RF lead extending away from the die pad in an opposite direction as the first RF lead, an RF transistor die mounted on the die pad such that a first outer edge side of the RF transistor die faces the first RF lead and a second outer edge side of the RF transistor die faces the second RF lead, the RF transistor die comprising an RF input terminal, an RF output terminal, and a reference potential terminal, a first capacitor integrally formed in the RF transistor die, the first capacitor comprising first and second terminals, and an output impedance matching network that electrically couples the RF output terminal to the second RF lead.

In an embodiment of the packaged amplifier circuit that can be combined with others, the output impedance matching network comprises a first electrically conductive bond wire or wires connected between the first terminal and the second RF lead, and a second electrically conductive bond wire or wires connected between the RF output terminal and the second RF lead, and the first and second bond wires are oriented transverse to one another.

In an embodiment of the packaged amplifier circuit that can be combined with others, the RF transistor die further comprises a rear side facing the die pad, an upper side facing away from the die pad, first, second, and sixth bond pads disposed on the upper side, and a third bond pad disposed on the rear side, the first bond pad is disposed closer to the second outer edge side than the first outer edge side, the second and sixth bond pads are disposed closer to the second outer edge side than the first outer edge side, the first bond pad provides the RF input terminal, the second bond pad provides the RF output terminal, the third bond pad provides the reference potential terminal, and the sixth bond provides the first terminal.

In an embodiment of the packaged amplifier circuit that can be combined with others, the first bond wires are substantially parallel to the second outer edge side, and the second bond wires are substantially perpendicular to the second outer edge side.

In an embodiment of the packaged amplifier circuit that can be combined with others, the second RF lead comprises one or more electrically isolated bond pads that are electrically isolated from the second RF lead, and the output impedance matching network comprises third electrically conductive bond wire or wires directly connected between the first terminal and the electrically isolated bond pads.

In an embodiment of the packaged amplifier circuit that can be combined with others, the second RF lead comprises a plurality of the electrically isolated bond pads, the output impedance matching network comprises fourth electrically conductive bond wire or wires directly connected between electrically isolated bond pads of the plurality, and the fourth and second bond wires are oriented substantially transverse to one another.

In an embodiment of an RF transistor die that can be combined with others, the RF transistor die includes an upper side, a rear side opposite the upper side, and first and second outer edge sides that extend between the upper and rear sides and are arranged opposite one another, an electrically conductive RF input pad disposed on the upper side, an electrically conductive RF output pad disposed on the upper side, a reference potential pad disposed on the lower side, a passive electrical connector integrally formed in the RF transistor die and comprising first and second end connection points, the RF input pad and the RF output pad are separated from one another in a width direction of the RF transistor die, the width direction being perpendicular to the first and second outer edge sides, the first and second end connection points are separated from one another in the width direction of the RF transistor die, and the passive electrical connector is electrically isolated from the RF input pad.

In an embodiment of the RF transistor die that can be combined with others, the first and second connection points are separated from one another in the width direction by at least a substantial majority of a width of the RF transistor die.

In an embodiment of the RF transistor die that can be combined with others, the first connection point is immediately adjacent to the first outer edge side.

In an embodiment of the RF transistor die that can be combined with others, the second connection point is immediately adjacent to the second outer edge side.

In an embodiment of the RF transistor die that can be combined with others, the RF transistor die further comprises a third conductive bond pad disposed on the upper side, the third conductive bond pad provides the first end connection point, and the third conductive bond pad is disposed closer to the first outer edge side than the second outer edge side.

In an embodiment of the RF transistor die that can be combined with others, the RF transistor die further comprises a fourth conductive bond pad disposed on the upper side, the fourth conductive bond pad provides the second end connection point, and the fourth conductive bond pad is disposed closer to the second outer edge side than the first outer edge side.

In an embodiment of the RF transistor die that can be combined with others, the passive electrical connector is internally directly electrically connected to the RF output pad, and the RF output pad provides the second end connection point of the passive electrical connector.

In an embodiment of the RF transistor die that can be combined with others, the RF transistor die further comprises a first monolithically integrated capacitor that is integrally formed within the RF transistor die, the RF transistor die comprises a sixth bond pad on the upper side, and the sixth bond pad provides the second end connection point and a first terminal of the first monolithically integrated capacitor.

The term "electrically connected" describes a permanent low-ohmic, i.e., low-resistance, connection between electrically connected elements, for example a wire connection, between the concerned elements. By contrast, the term "electrically coupled" describes a connection with a non-negligible impedance (ether resistive or reactive) between the concerned elements. For instance, active elements, such as transistors, as well as passive elements, such as inductors, capacitors, diodes, resistors, etc., may electrically couple two elements together.

A direct electrical connection describes a connection with direct physical contact between two electrically conductive elements, for example a bond wire and a bond pad.

Terms such as "same," "match," and "matches" as used herein are intended to mean identical, nearly identical or approximately so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A packaged amplifier circuit, comprising:
an RF package comprising an electrically conductive die pad, an electrically conductive first RF lead extending away from the die pad, and an electrically conductive second RF lead extending away from the die pad in an opposite direction as the first RF lead;

an RF transistor die mounted on the die pad such that a first outer edge side of the RF transistor die faces the first RF lead and a second outer edge side of the RF transistor die faces the second RF lead; and a passive electrical connector integrally formed in the RF transistor die, the passive electrical connector comprising: a first end connection point disposed closer to the first outer edge side, and a second end connection point disposed closer to the second outer edge side; and a first discrete reactive device mounted on the die pad between the first outer edge side of the RF transistor die and the first RF lead;

wherein the passive electrical connector electrically couples the first discrete reactive device to the second RF lead.

2. The packaged amplifier circuit of claim 1, wherein the RF transistor die comprises an RF input terminal, an RF output terminal, and a reference potential terminal, and wherein the passive electrical connector is electrically isolated from the RF input terminal.

3. The packaged amplifier circuit of claim 2, wherein the packaged amplifier circuit further comprises an output impedance matching network that is electrically connected to the second RF lead, the RF output terminal and the reference potential terminal, and wherein the first discrete reactive device and the passive electrical connector form at least part of the output impedance matching network.

4. The packaged amplifier circuit of claim 3, wherein the RF transistor die is configured to amplify an RF signal as between the RF input terminal and the RF output terminal across a fundamental RF frequency range, wherein the passive electrical connector and the first discrete reactive device collectively provide a first LC branch of the output impedance matching network, wherein the first LC branch is connected in parallel with the RF output terminal and the reference potential terminal, and wherein the first LC branch is configured to resonate at a frequency that is below the fundamental RF frequency range.

5. The packaged amplifier circuit of claim 4, wherein the first discrete reactive device is a chip capacitor, and wherein the inductance of the first LC branch is substantially provided by an inductance of the passive electrical connector.

6. The packaged amplifier circuit of claim 4, wherein the RF transistor die further comprises:

a rear side facing the die pad;

an upper side facing away from the die pad;

first, second, and fourth bond pads disposed on the upper side;

a third bond pad disposed on the rear side, wherein the first and fourth bond pads are disposed closer to the first outer edge side than the second outer edge side, wherein the second bond pad is disposed closer to the second outer edge side than the first outer edge side, wherein the first bond pad provides the RF input terminal, wherein the second bond pad provides the RF output terminal, wherein the third bond pad provides the reference potential terminal, and wherein the fourth bond provides the first end connection point.

7. The packaged amplifier circuit of claim 6, wherein the passive electrical connector is internally connected within the RF transistor die to the second bond pad, and wherein the second bond pad provides the second end connection point.

8. The packaged amplifier circuit of claim 6, wherein the RF transistor die comprises a fifth bond pad disposed on the upper side closer to the second outer edge side than the first outer edge side, wherein the fifth bond pad provides the second end connection point.

9. The packaged amplifier circuit of claim 8, further comprising a second discrete reactive device mounted on the die pad between the second outer edge side of the RF transistor die and the second RF lead, wherein the second discrete reactive device forms part of the output impedance matching network, and wherein the second discrete reactive device is directly connected to the second end connection point of the passive electrical connector.

10. The packaged amplifier circuit of claim 6, further comprising a first monolithically integrated capacitor that is integrally formed within the RF transistor die, wherein the first monolithically integrated capacitor forms part of the output impedance matching network, and wherein a first terminal of the first monolithically integrated capacitor is provided by a sixth bond pad that is disposed on the upper side.

11. The packaged amplifier circuit of claim 10, wherein the passive electrical connector electrically is internally connected within the RF transistor die to the second bond pad, wherein the second bond pad provides the second end connection point, and wherein the second bond pad is electrically connected to the sixth bond pad by one or more electrically conductive bond wires.

12. The packaged amplifier circuit of claim 10, wherein the passive electrical connector electrically is internally connected within the RF transistor die to the sixth bond pad, and wherein the sixth bond pad provides the second end connection point.

13. The packaged amplifier circuit of claim 10, wherein the RF transistor die is immediately adjacent to the second RF lead such that a space between the second edge side of the RF transistor die and the second RF lead is devoid of discrete components.

14. A packaged amplifier circuit, comprising:

an RF package comprising an electrically conductive die pad, an electrically conductive first RF lead extending away from the die pad, and an electrically conductive second RF lead extending away from the die pad in an opposite direction as the first RF lead;

an RF transistor die mounted on the die pad such that a first outer edge side of the RF transistor die faces the first RF lead and a second outer edge side of the RF transistor die faces the second RF lead, the RF transistor die comprising an RF input terminal, an RF output terminal, and a reference potential terminal;

a first capacitor integrally formed in the RF transistor die, the first capacitor comprising first and second terminals; and an output impedance matching network that electrically couples the RF output terminal to the second RF lead, wherein the first capacitor forms at least part of the output impedance matching network.

15. The packaged amplifier circuit of claim 14, wherein the output impedance matching network comprises first electrically conductive bond wire or wires connected between the first terminal and the RF output terminal, and second electrically conductive bond wire or wires connected between the RF output terminal and the second RF lead, and wherein the first and second bond wires are oriented transverse to one another.

16. The packaged amplifier circuit of claim 15, wherein the RF transistor die further comprises:

a rear side facing the die pad;

an upper side facing away from the die pad;

first, second, and sixth bond pads disposed on the upper side; and
a third bond pad disposed on the rear side,
wherein the first bond pad is disposed closer to the first outer edge side than the second outer edge side,
wherein the second and sixth bond pads are disposed closer to the second outer edge side than the first outer edge side,
wherein the first bond pad provides the RF input terminal,
wherein the second bond pad provides the RF output terminal,
wherein the third bond pad provides the reference potential terminal, and
wherein the sixth bond provides the first terminal.

17. The packaged amplifier circuit of claim 16, wherein the first bond wires are substantially parallel to the second outer edge side, and wherein the second bond wires are substantially perpendicular to the second outer edge side.

18. The packaged amplifier circuit of claim 14, wherein the second RF lead comprises one or more electrically isolated bond pads that are electrically isolated from the second RF lead, and wherein the output impedance matching network comprises third electrically conductive bond wire or wires directly connected between the first terminal and the electrically isolated bond pads.

19. The packaged amplifier circuit of claim 18, wherein the second RF lead comprises a plurality of the electrically isolated bond pads, wherein the output impedance matching network comprises fourth electrically conductive bond wire or wires directly connected between electrically isolated bond pads of the plurality, and wherein the fourth and second bond wires are oriented substantially transverse to one another.

20. An RF transistor die, comprising:
an upper side, a rear side opposite the upper side, and first and second outer edge sides that extend between the upper and rear sides and are arranged opposite one another;
an electrically conductive RF input pad disposed on the upper side;
an electrically conductive RF output pad disposed on the upper side;
a reference potential pad disposed on the lower side;
a passive electrical connector integrally formed in the RF transistor die and comprising first and second end connection points,
wherein the RF input pad and the RF output pad are separated from one another in a width direction of the RF transistor die, the width direction being perpendicular to the first and second outer edge sides,
wherein the first and second end connection points are separated from one another in the width direction of the RF transistor die, and
wherein the passive electrical connector is electrically isolated from the RF input pad.

21. The RF transistor die of claim 20, wherein the first and second connection points are separated from one another in the width direction by at least a substantial majority of a width of the RF transistor die.

22. The RF transistor die of claim 21, wherein the first connection point is immediately adjacent to the first outer edge side.

23. The RF transistor die of claim 22, wherein the second connection point is immediately adjacent to the second outer edge side.

24. The RF transistor die of claim 20, wherein the RF transistor die further comprises a third conductive bond pad disposed on the upper side, wherein the third conductive bond pad provides the first end connection point, and wherein the third conductive bond pad is disposed closer to the first outer edge side than the second outer edge side.

25. The RF transistor die of claim 24, wherein the RF transistor die further comprises a fourth conductive bond pad disposed on the upper side, wherein the fourth conductive bond pad provides the second end connection point, and wherein the fourth conductive bond pad is disposed closer to the second outer edge side than the first outer edge side.

26. The RF transistor die of claim 24, wherein the passive electrical connector is internally directly electrically connected to the RF output pad, and wherein the RF output pad provides the second end connection point of the passive electrical connector.

27. The RF transistor die of claim 20, further comprising a first monolithically integrated capacitor which is integrally formed within the RF transistor die, wherein the RF transistor die comprises a sixth bond pad on the upper side, and wherein the sixth bond pad provides the second end connection point and a first terminal of the first monolithically integrated capacitor.

* * * * *